(12) United States Patent
Lee et al.

(10) Patent No.: US 8,072,793 B2
(45) Date of Patent: Dec. 6, 2011

(54) HIGH DENSITY RESISTANCE BASED SEMICONDUCTOR DEVICE

(75) Inventors: Ming-Daou Lee, Chiayi (TW); Erh-Kun Lai, Longjing Shiang (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 282 days.

(21) Appl. No.: 12/204,515

(22) Filed: Sep. 4, 2008

(65) Prior Publication Data

US 2010/0054014 A1    Mar. 4, 2010

(51) Int. Cl.
*G11C 11/00* (2006.01)

(52) U.S. Cl. .................. 365/148; 365/175; 438/104

(58) Field of Classification Search .................. 365/243, 365/113, 115, 163, 100, 148, 189.03, 185.23, 365/185.13
See application file for complete search history.

(56) References Cited

U.S. PATENT DOCUMENTS

| | | | |
|---|---|---|---|
| 5,963,472 A * | 10/1999 | Inada et al. ............ 365/175 |
| 6,420,215 B1 | 7/2002 | Knall et al. | |
| 6,501,111 B1 | 12/2002 | Lowrey | |
| 6,664,117 B2 | 12/2003 | Zhuang et al. | |
| 6,673,691 B2 | 1/2004 | Zhuang et al. | |
| 6,759,249 B2 | 7/2004 | Zhuang et al. | |
| 6,849,891 B1 | 2/2005 | Hsu et al. | |
| 6,952,038 B2 | 10/2005 | Hsu et al. | |
| 7,009,278 B2 | 3/2006 | Hsu | |
| 7,177,169 B2 | 2/2007 | Scheuerlein | |
| 7,361,924 B2 | 4/2008 | Breuil et al. | |
| 7,800,094 B2 * | 9/2010 | Ho et al. ............ 257/4 |
| 2003/0002338 A1 * | 1/2003 | Xu et al. ............ 365/185.11 |
| 2006/0033182 A1 | 2/2006 | Hsu | |
| 2006/0097238 A1 | 5/2006 | Breuil et al. | |
| 2006/0273298 A1 * | 12/2006 | Petti ................ 257/5 |
| 2006/0284281 A1 | 12/2006 | Hsu | |
| 2007/0048990 A1 | 3/2007 | Zhuang et al. | |
| 2007/0114508 A1 | 5/2007 | Herner et al. | |
| 2008/0206931 A1 | 8/2008 | Breuil et al. | |
| 2009/0135637 A1 * | 5/2009 | Takase ............ 365/51 |
| 2009/0180310 A1 * | 7/2009 | Shimomura et al. ...... 365/148 |

* cited by examiner

*Primary Examiner* — Dang Nguyen

(74) *Attorney, Agent, or Firm* — Haynes Beffel & Wolfeld LLP

(57) ABSTRACT

Memory devices are described along with methods for manufacturing. A memory device as described herein includes a plurality of memory cells located between word lines and bit lines. Each memory cell comprises a diode and a plurality of memory elements each comprising one or more metal-oxygen compounds, the diode and the plurality of memory elements arranged in electrical series along a current path between a corresponding word line and a corresponding bit line.

21 Claims, 24 Drawing Sheets

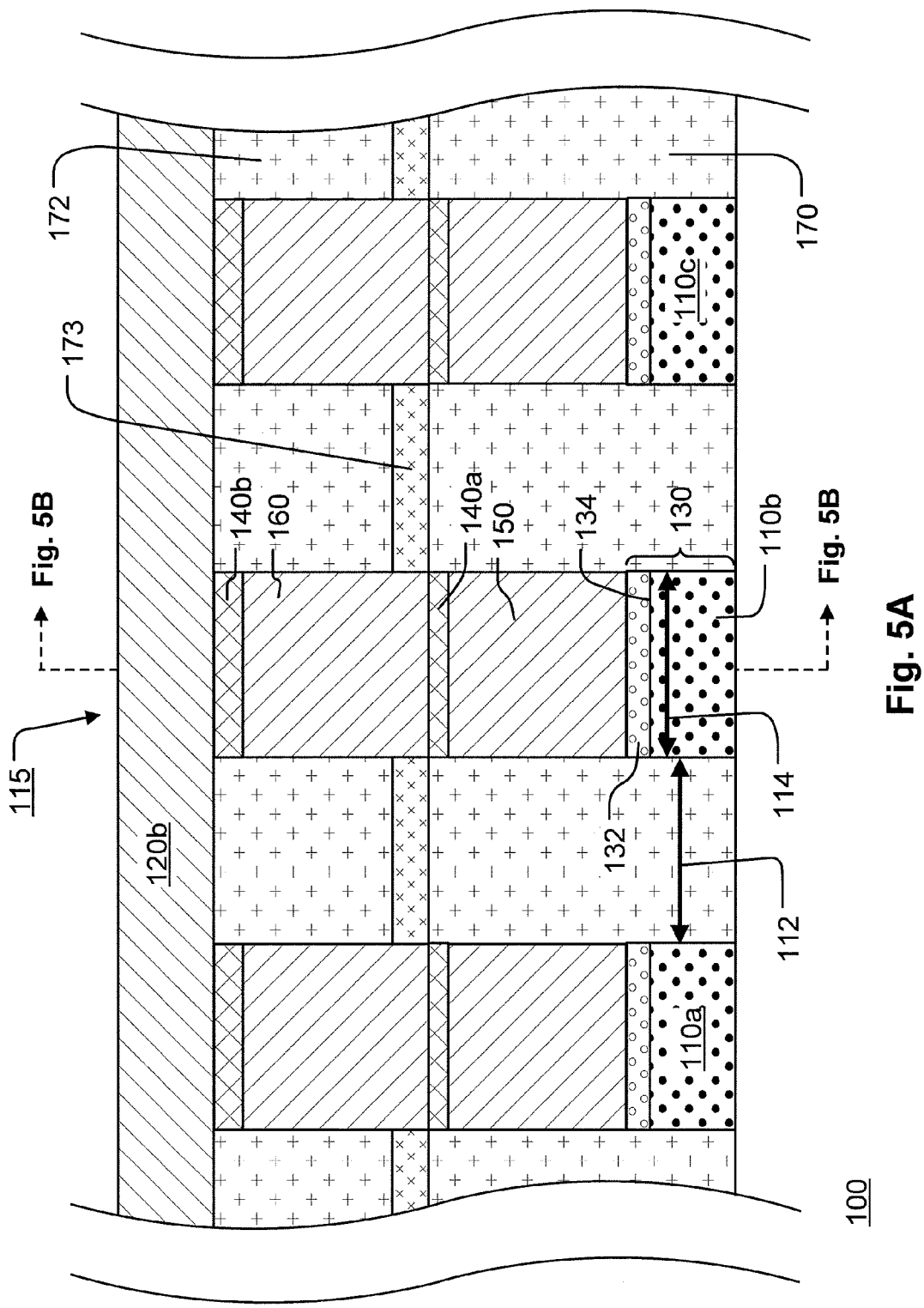

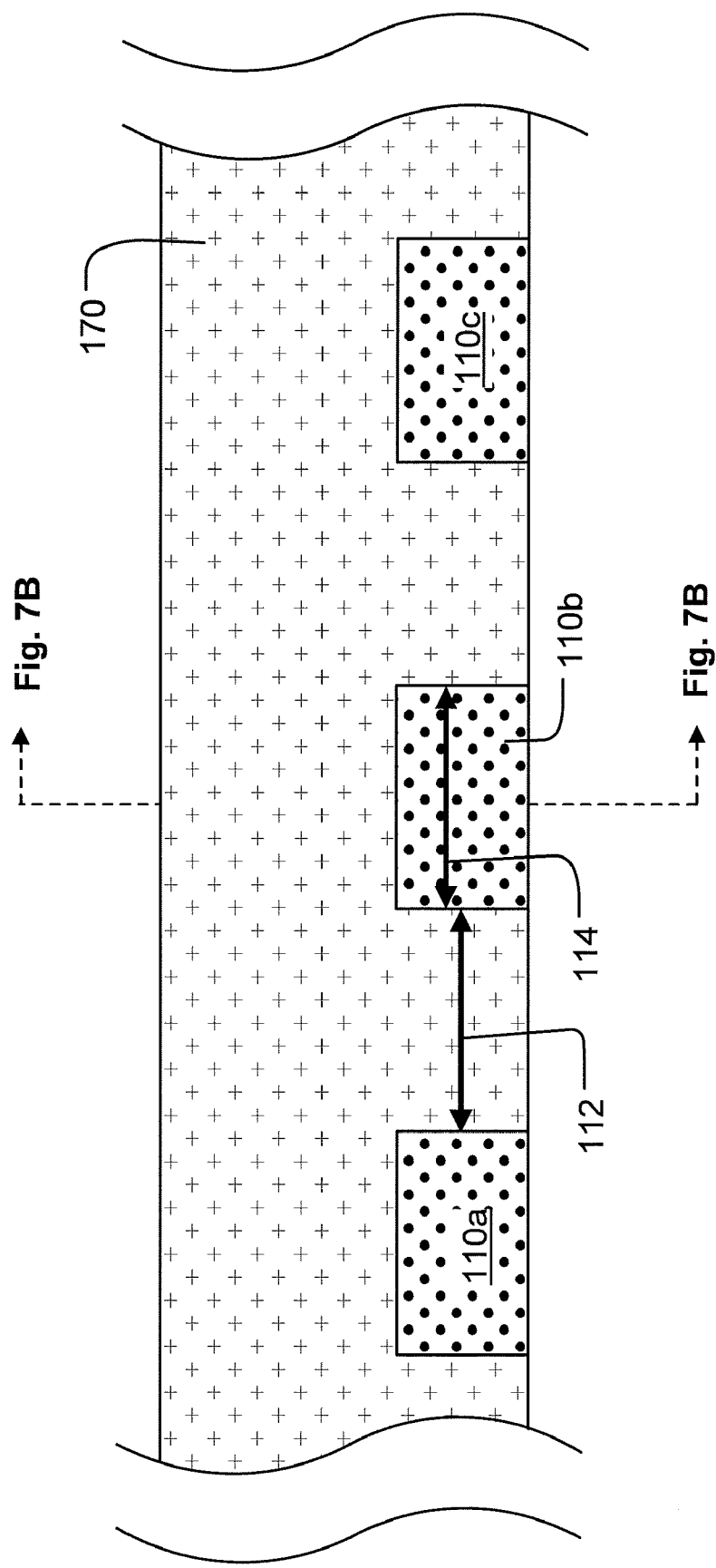

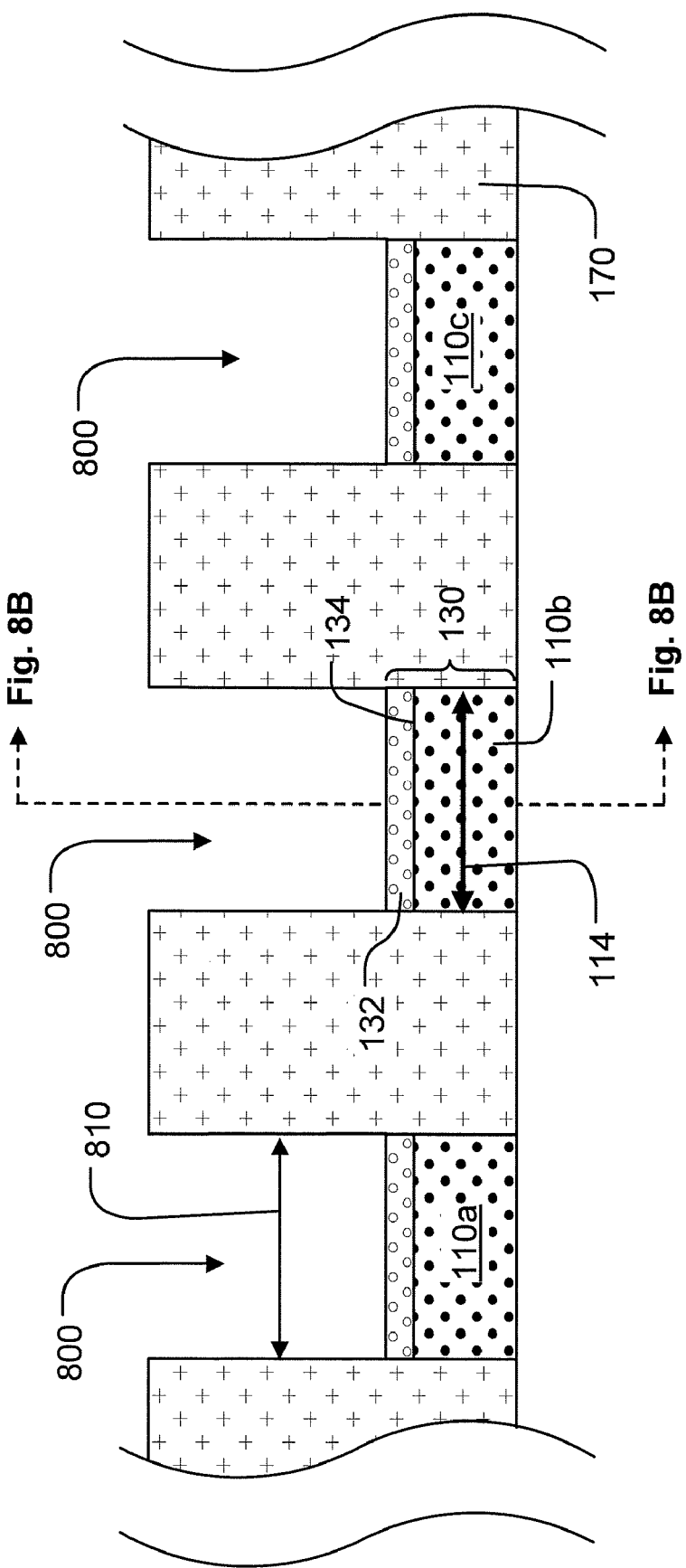

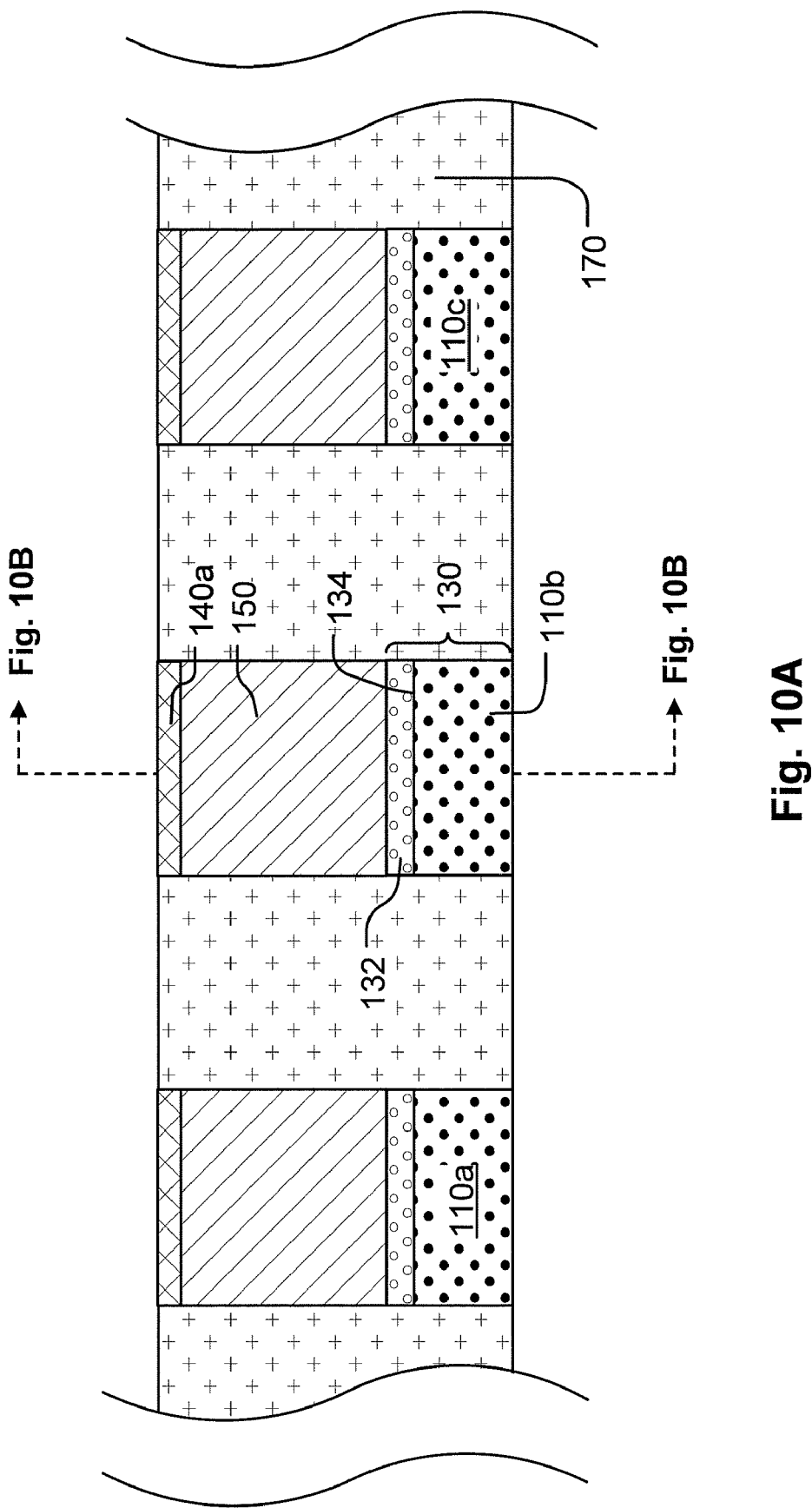

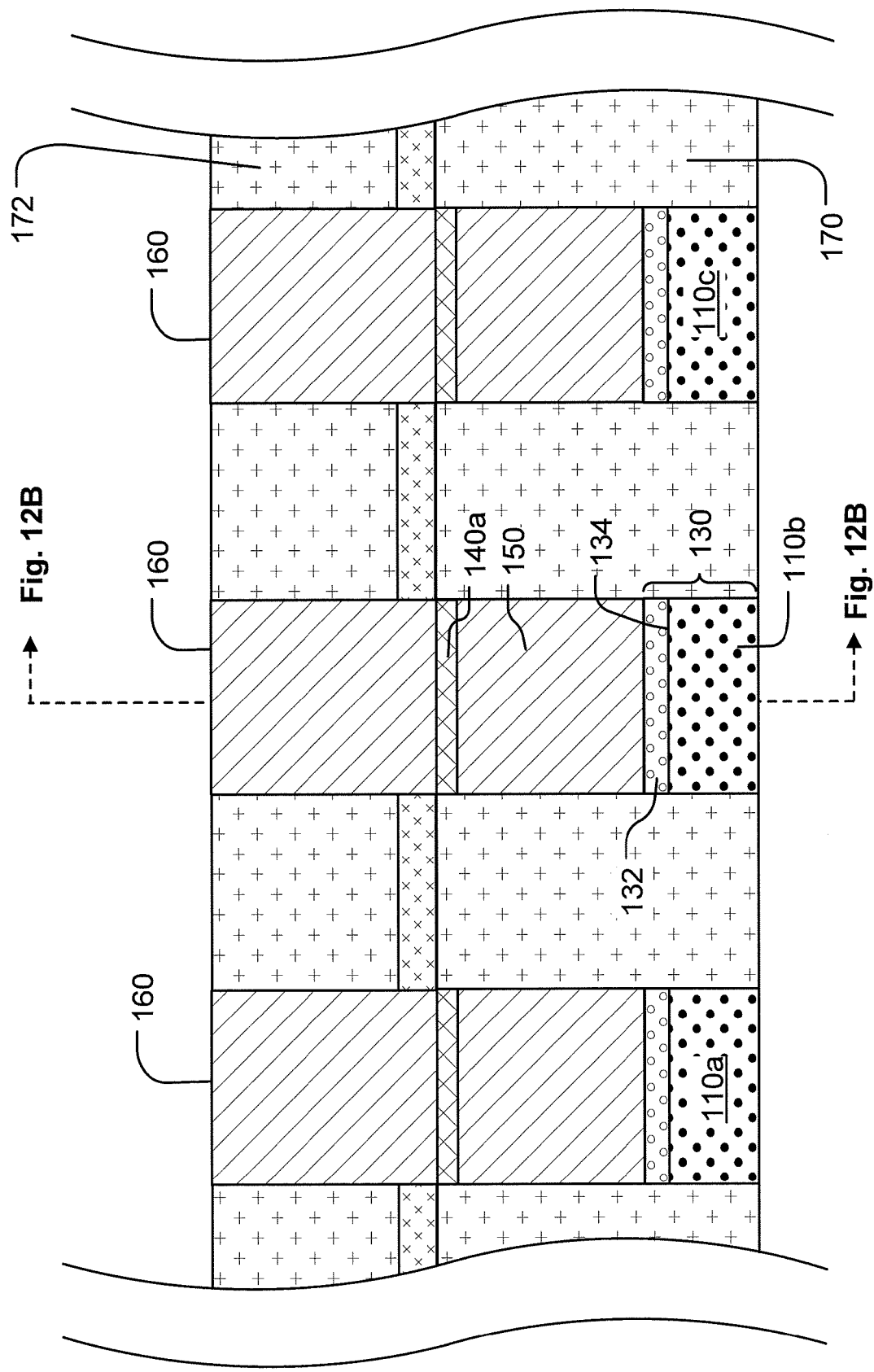

HIGH DENSITY RESISTANCE BASED SEMICONDUCTOR DEVICE

BACKGROUND OF THE INVENTION

1. Field of the Invention

The present invention relates to memory devices and methods for manufacturing memory devices, and more particularly to high density three-dimensional (3D) memory devices having a plurality of programmable resistive memory elements based on metal-oxygen compounds.

2. Description of Related Art

Metal oxide based nonvolatile resistive random access memory RRAM has attracted much attention because of its simple structure and excellent properties such as low power, high speed, and a large memory window between resistive states.

Tungsten-oxygen $WO_x$ based RRAM can be caused to change resistance between two or more stable ranges by application of electrical pulses at levels suitable for implementation in integrated circuits, and the resistance can be read and written with random access to indicate stored data. See, U.S. patent application Ser. No. 11/955,137 entitled "Memory Devices Having an Embedded Resistance Memory with Tungsten Compound and Manufacturing Methods", filed 12 Dec. 2007 and incorporated by reference herein.

Multi-level operation comprises changing the resistance of the metal-oxide material between more than two resistance states and is desirable since the data storage density can be increased.

Additionally, in order to achieve higher density it is desirable to reduce the cross-sectional area or footprint of individual memory cells in an array of memory cells. However, problems have arisen in manufacturing devices with very small dimensions, and with variations in manufacturing processes needed to meet the tight tolerance requirements necessary for large-scale high-density memory devices.

It is therefore desirable to provide a metal-oxide based memory cell structure for use in high-density memory devices having multi-level operation, as well as methods for manufacturing which address the tight process requirements needed for manufacturing large-scale high density devices.

SUMMARY OF THE INVENTION

A memory device as described herein includes a plurality of word lines and a plurality of bit lines. The device includes a plurality of memory cells located between the word lines and bit lines. Each memory cell comprises a diode and a plurality of memory elements comprising one or more metal-oxygen compounds, the diode and the plurality of memory elements arranged in electrical series along a current path between a corresponding word line in the plurality of word lines and a corresponding bit line in the plurality of bit lines.

A method for manufacturing a memory device as described herein includes forming a plurality of word lines having a first conductivity type. A first dielectric is formed overlying the word lines and an array of first vias are formed in the first dielectric to expose portions of the word lines. A plurality of semiconductor regions are formed within the exposed portions of the word lines, the semiconductor regions having a conductivity type opposite the first conductivity type. A plurality of first memory elements are formed within the array of first vias, the first memory elements comprising one or more metal-oxygen compounds. A second dielectric is formed overlying the first memory elements. An array of second vias are formed in the second dielectric to expose top surfaces of the first memory elements. A plurality of second memory elements are formed within the array of second vias, the second memory elements comprising one or more metal-oxygen compounds. A plurality of bit lines are formed overlying the second memory elements.

Memory arrays having memory cells as described herein result in high density memory and provide multi-level operation. In embodiments the cross-sectional area of the memory cells of the array is determined by dimensions of word lines and bit lines, allowing for a high density for the array. The word lines have word line widths and adjacent word lines are separated by a word line separation distance, and the bit lines have bit line widths and adjacent bit lines are separated by a bit line separation distance. In preferred embodiments the summation of the word line width and the word line separation distance is equal to twice a feature size F used to form the array, and the summation of the bit line width and the bit line separation distance is equal to twice the feature size F. Additionally, F is preferably a minimum feature size for a process (typically a lithographic process) used to form the bit lines and word lines, such that the memory cells of the array have a memory cell area of $4 F^2$.

Other aspects and advantages of the present invention can be seen on review of the drawings, the detailed description and the claims, which follow.

BRIEF DESCRIPTION OF THE DRAWINGS

FIGS. 5A-5B illustrate cross-sectional views of a portion of an embodiment of memory cells arranged in the cross-point array.

DETAILED DESCRIPTION

Figure 1:
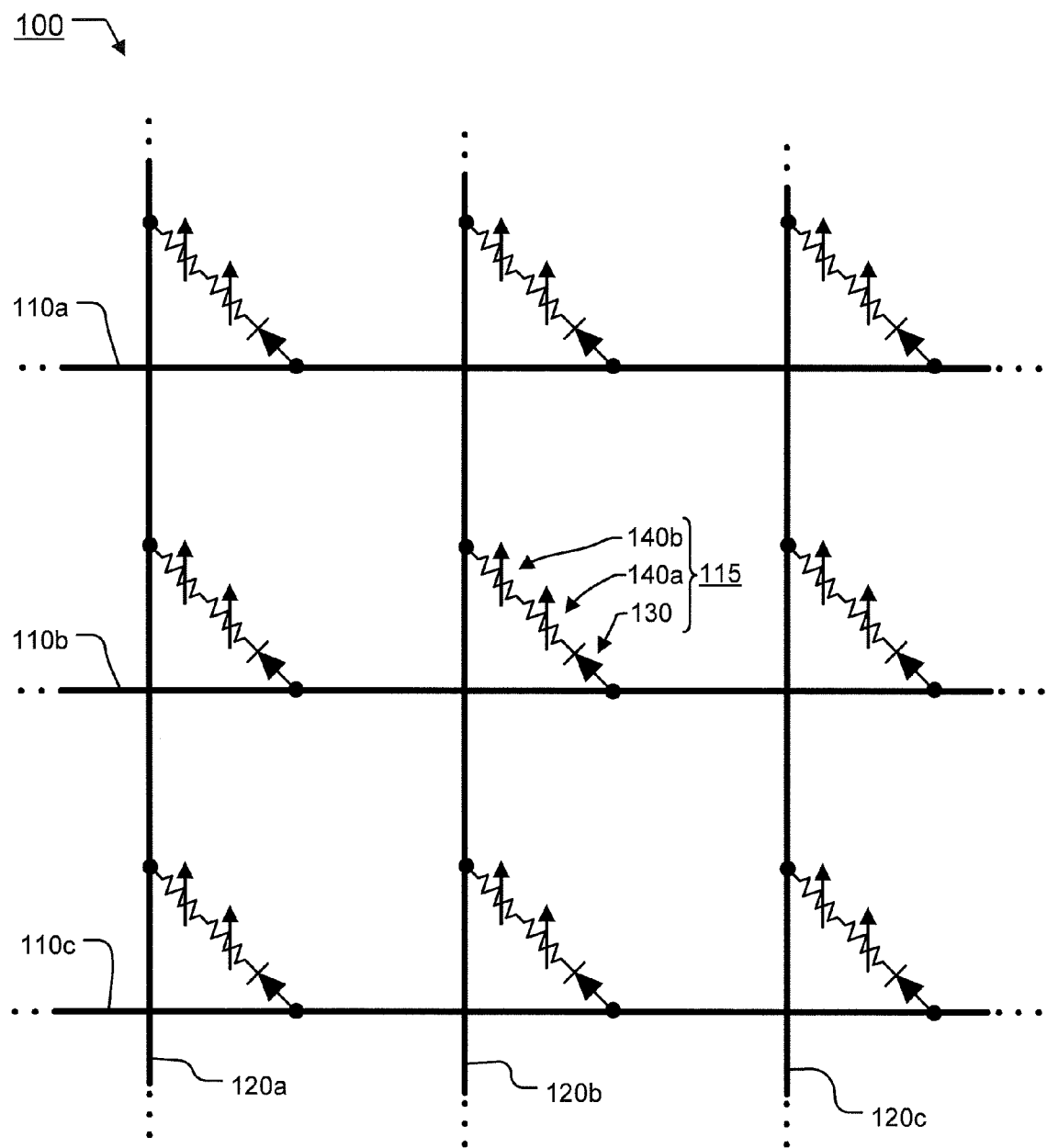
FIG. 1 is a schematic diagram of a portion of a cross-point array implemented using three-dimensional memory cells as described herein.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a cross-point memory array 100 implemented using three-dimensional memory cells as described herein, each memory cell having a plurality of metal-oxide based memory elements and a diode access device. In FIG. 1, each memory cell includes two metal-oxide based memory elements. Alternatively, each memory cell may comprise more than two metal-oxide memory elements. In some embodiments the material of the memory elements comprise at least one of tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, and $(BaSr)TiO_3$.

As shown in the schematic diagram of FIG. 1, each of the memory cells of the array 100 includes a diode access device and a plurality of metal-oxide based memory elements (each represented in FIG. 1 by a variable resistor) arranged in series along a current path between a corresponding word line 110 and a corresponding bit line 120. As described in more detail below, the memory elements in a given memory cell are programmable to a plurality of resistance states and have different resistive state change behaviors versus voltage applied across the cell such that the memory cell is programmable to three or more resistance states. Thus, a voltage pulse applied across the memory cell can result in one memory element in the cell undergoing a resistive state change while the second memory element may undergo a different resistive state change, or even no resistive state change at all. The total resistance of all the memory elements indicates the data value stored in the memory cell, the difference in resistive state change behavior for each memory element allows each memory cell to store multiple bits of data, resulting in high density data storage for array 100.

The array 100 comprises a plurality of word lines 110 including word lines 110a, 110b, and 110c extending in parallel in a first direction, and a plurality of bit lines 120 including bit lines 120a, 120b, and 120c extending in parallel in a second direction perpendicular to the first direction. The array 100 is referred to as a cross-point array because the word lines 110 and bit lines 120 are arranged in such a manner that a given word line 110 and a given bit line 120 cross over each other but do not physically intersect, and the memory cells are located at these cross-point locations of the word lines 110 and bit lines 120.

Memory cell 115 is representative of the memory cells of array 100 and is arranged at the cross-point location of the word line 110b and the bit line 120b, the memory cell 115 comprising a diode 130 and first and second memory elements 140a, 140b arranged in series. The diode 130 is electrically coupled to the word line 110b and the second memory element 140b is electrically coupled to the bit line 120b.

Reading or writing to memory cell 115 of array 100 can be achieved by applying appropriate voltage pulses to the corresponding word line 110b and bit line 120b to induce a current through the selected memory cell 115. The level and duration of the voltages applied is dependent upon the operation performed, e.g. a reading operation or a programming operation.

Figure 14:
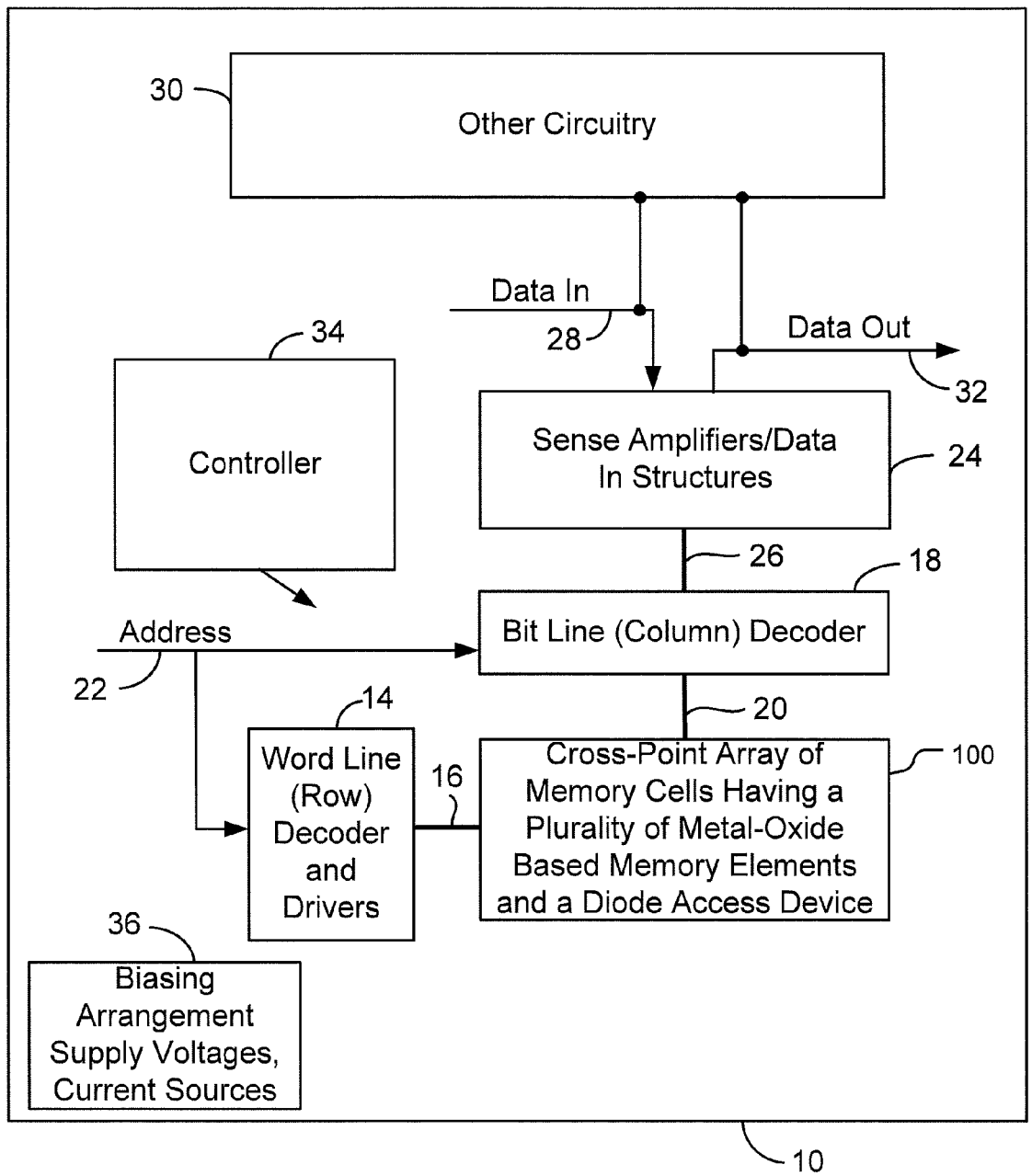
FIG. 14 is a simplified block diagram of an integrated circuit including a cross-point array of memory cells having a plurality of tungsten-oxide based memory elements and diode access devices as described herein.

In a read (or sense) operation of the data value stored in the memory cell 115, bias circuitry (See, for example, biasing arrangement supply voltages, current sources 36 of FIG. 14) coupled to the corresponding word line 110b and bit line 120b to apply bias arrangements across the memory cell 115 of suitable amplitude and duration to induce current to flow which does not result in any of the memory elements 140 undergoing a change in resistive state. The current through the memory cell 115 is dependant upon the total resistance of the memory elements 140 and thus the data value stored in the memory cell 115.

In a program operation of a data value to be stored in the memory cell 115, bias circuitry (See, for example, biasing arrangement supply voltages, current sources 36 of FIG. 14) coupled to the corresponding word line 110b and bit line 120b to apply bias arrangements across the memory cell 115 of suitable amplitude and duration to induce a programmable change in one or more of the memory elements 140 to store the data value in the memory cell 115, the total electrical resistance of the memory elements 140 corresponding to the data value stored in the memory cell 115.

Figure 2:
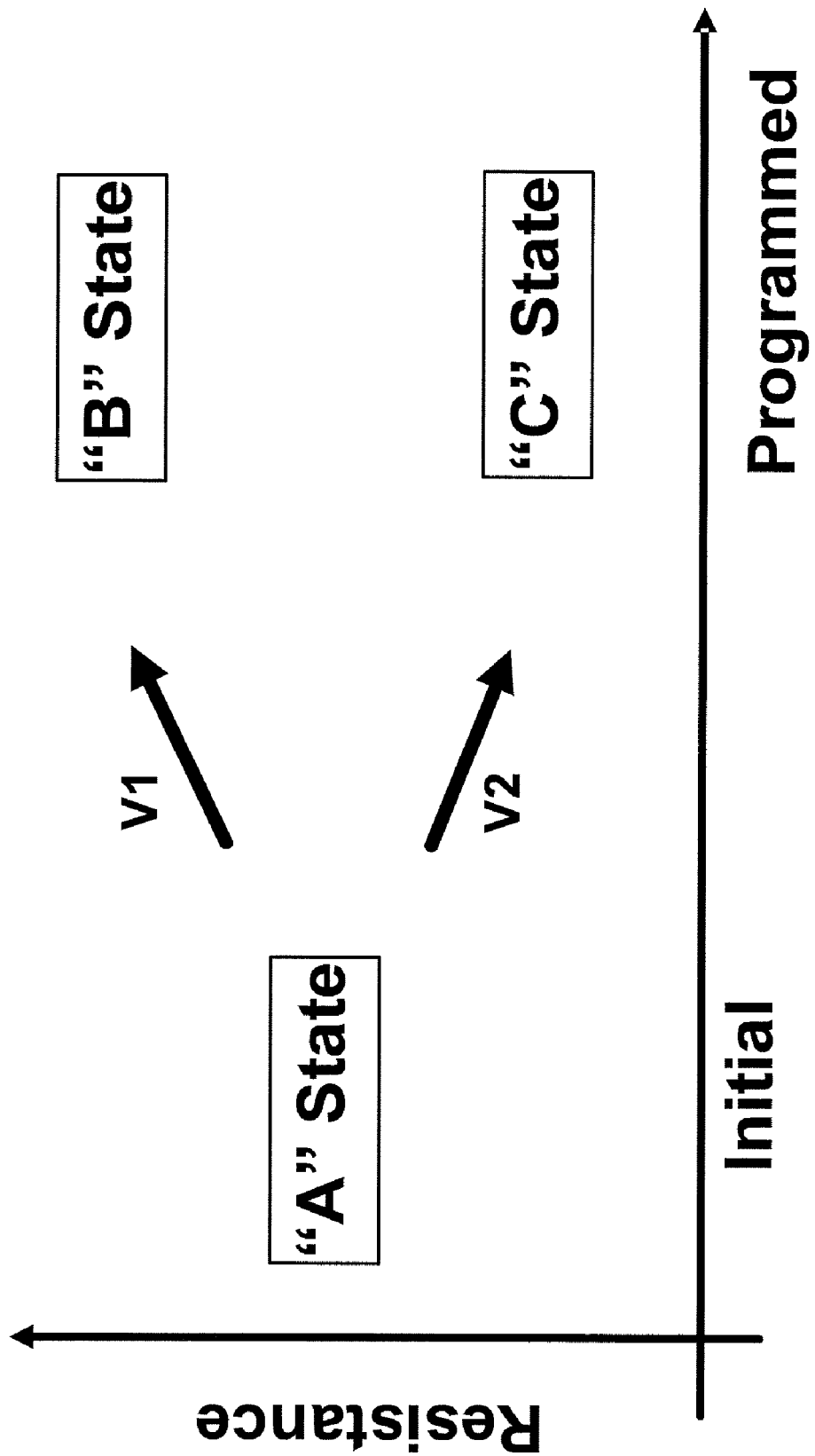
FIG. 2 conceptually illustrates the resistive state change behavior of a single tungsten-oxide based memory element programmable to a plurality of resistance states.

FIG. 2 conceptually illustrates the resistive state change behavior of a single metal-oxide based memory element programmable to a plurality of resistance states. As shown in FIG. 2, the memory element has an initial resistance within a resistive range corresponding to initial resistive state "A". For example, the initial resistance may be about 1000 ohms.

A first voltage pulse having a magnitude V1 applied across the memory element is sufficient to induce a change in the resistance state of the memory element from the initial resistance state "A" to a resistive value within a resistance range corresponding to a second resistive state "B". For example, the magnitude V1 of the first voltage pulse may be 5 Volts and the resistance of the memory element may be changed to 10,000 ohms.

Also, a second voltage pulse having a magnitude V2 applied across the memory element is sufficient to induce a change in the resistance state of the memory element from the initial resistance state "A" to a resistive value within a resistance range corresponding to a third resistive state "C". For example, the magnitude V2 of the first voltage pulse may be 7 Volts and the resistance of the memory element may be changed to 100 ohms.

In this example the magnitude V1 of the first voltage pulse is different from the magnitude V2 of the second voltage pulse. Generally, the first and second voltage pulses may have different voltage magnitudes and/or pulse lengths.

Since the resistive states A, B and C correspond to non-overlapping resistive ranges of the resistance of the memory element, a data value stored in the memory element can be determined by measuring the resistance of the memory element.

Figure 3:
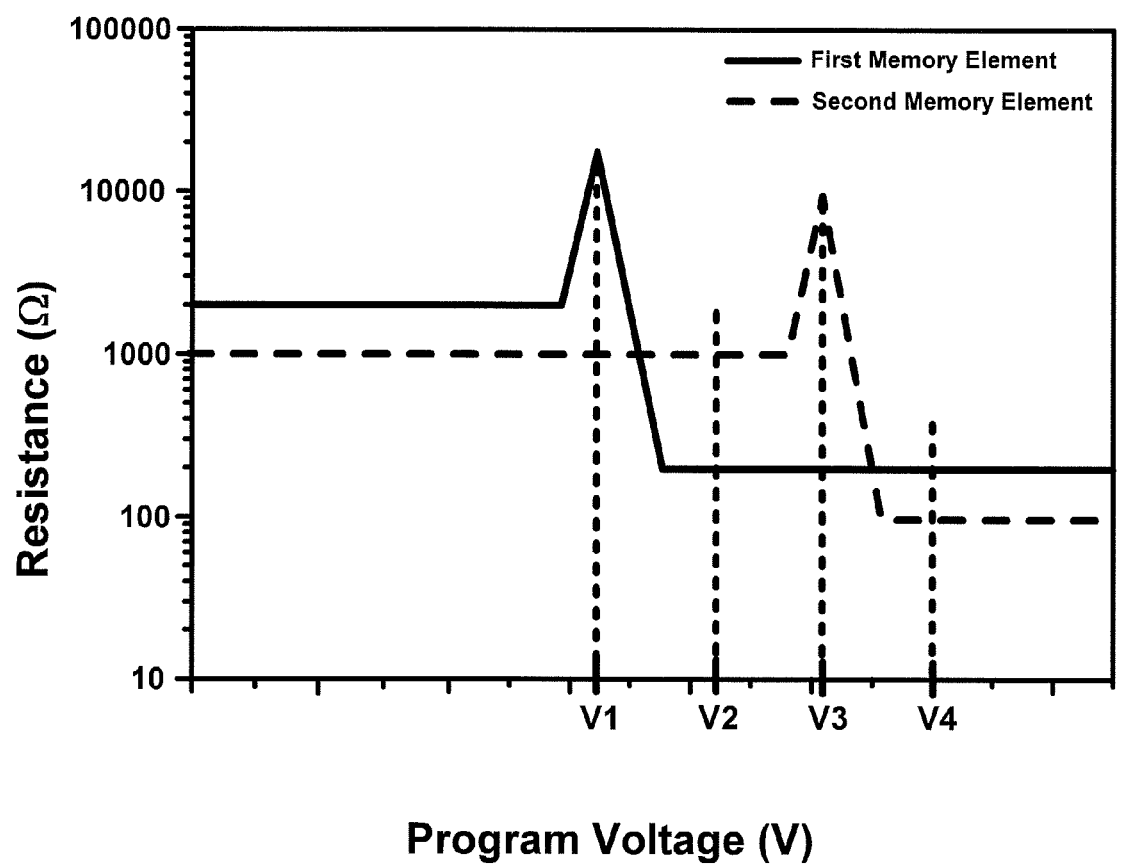
FIGS. 3 and 4 conceptually illustrate the resistive state change behavior of a memory cell having a first tungsten-oxide based memory element and a second tungsten-oxide based memory element arranged in series.
Figure 4:
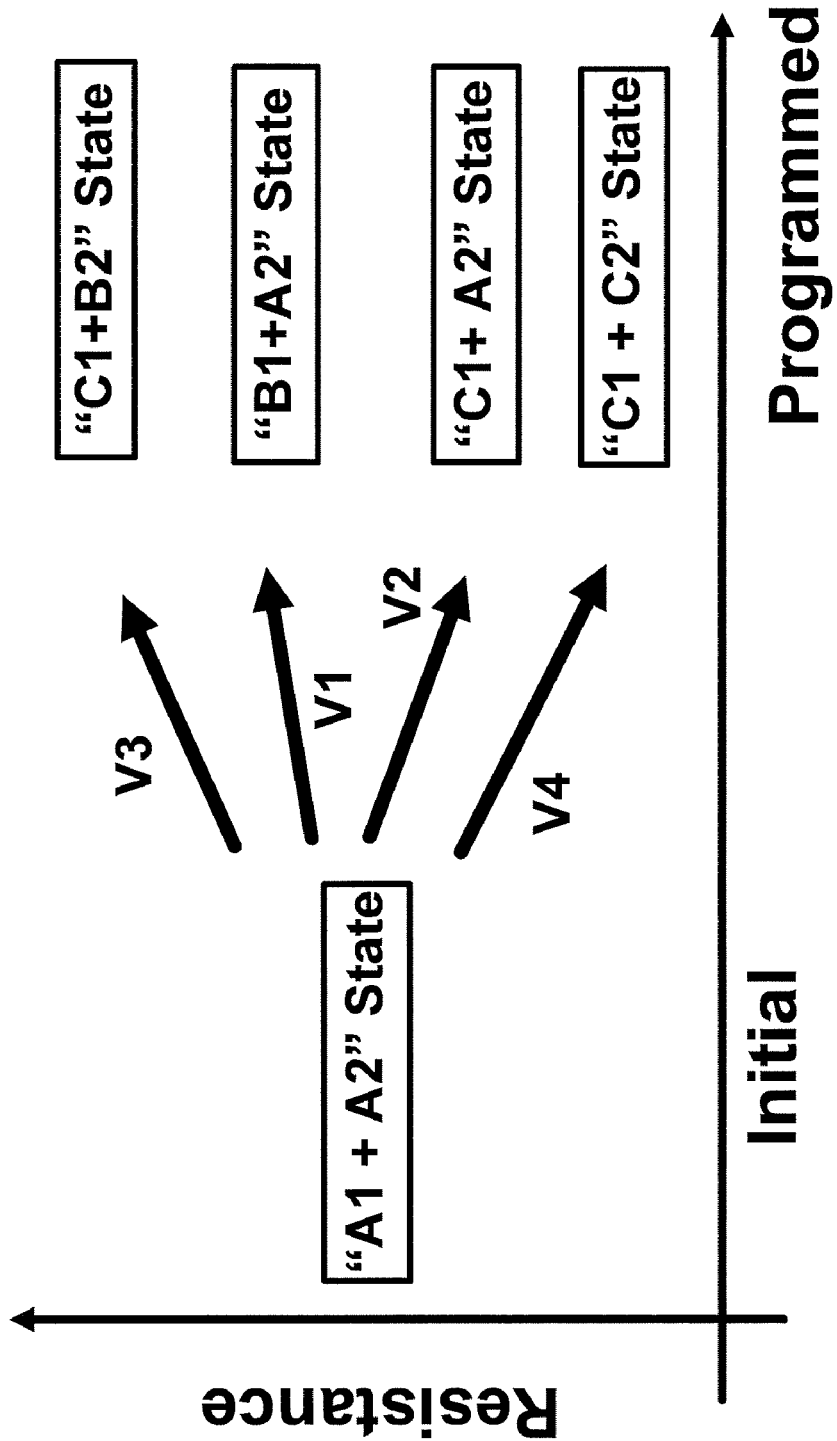

FIGS. 3 and 4 conceptually illustrate the resistive state change behavior of a memory cell 115 having a first metal-oxide based memory element 140a and a second metal-oxide based memory element 140b arranged in series. Metal-oxide based memory elements as described herein allow for unipolar operation of the memory cells. Unipolar operation involves programming and erasing using pulses having the same voltage polarity applied across the cells.

As shown in FIG. 3, the memory elements 140a, 140b of the memory cell 115 have different resistive state change behaviors versus applied voltage. Thus, a bias arrangement applied across the memory cell 115 to store a data value in the memory cell 115 can result in one memory element undergoing a resistive state change while the second memory element may undergo a different resistive state change, or even no resistive state change at all.

The table below summarizes the conceptual resistive state change of the first and second memory elements 140a, 140b as illustrated in FIGS. 3-4 for various applied voltages, as well as the corresponding change in the total resistance of memory elements 140a, 140b of the memory cell 115. As will be understood, the resistance values of the table below and FIGS. 3 and 4 are examples in order to illustrate the present invention, and the actual resistance values will depend upon the implementation of the memory elements and the memory cells as well as the voltage pulses applied across the memory cell.

|                | R@initial | R@V1  | R@V2 | R@V3  | R@V4 |
|----------------|-----------|-------|------|-------|------|
| First Element  | 2000      | 20000 | 200  | 200   | 200  |
| Second Element | 1000      | 1000  | 1000 | 10000 | 100  |
| Total          | 3000      | 21000 | 1200 | 10200 | 300  |

The first memory element 140a has an initial resistance within a resistive range corresponding to an initial resistive state "A1", and the second memory element 140b has an initial resistance within a resistive range corresponding to an initial resistive state "A2". The summation of the initial resistances of the first and second memory elements 140a, 140b is within a resistive range corresponding to an initial resistive state "A1+A2" of the memory cell 115 as shown in FIG. 4. In the illustrated example the initial resistance of the first memory element 140a is 2000 ohms, the initial resistance of the second memory element 140b is 1000 ohms, and thus the total resistance is 3000 ohms.

As shown in FIGS. 3 and 4, a first bias arrangement to store a first data value comprising a first voltage pulse having a magnitude V1 applied across the memory cell establishes a resistance in the first memory element 140a within a resistance range corresponding to a high resistance state "B1". The first bias arrangement does not induce a resistive state change in the second memory element 140b and thus the second memory element 140b maintains a resistance within the resistance range corresponding to initial resistive state "A2". The summation of the resistances of the first and second memory elements 140a, 140b is within a resistive range corresponding to a resistance state "B1+A2" of the memory cell 115. In the illustrated example the resistance of the first memory element 140a is changed to 20,000 ohms, the resistance of the second memory element 140b stays at 1000 ohms, and thus the total resistance changes to 21,000 ohms.

As shown in FIGS. 3 and 4, applying a second bias arrangement comprising a second voltage pulse to store a second data value having a magnitude V2 across the memory cell 115 establishes a resistance in the first memory element 140a within a resistance range corresponding to a low resistance state "C1". The second bias arrangement does not induce a resistive state change in the second memory element 140b and thus the second memory element 140b maintains a resistance within the resistance range corresponding to initial resistive state "A2". The summation of the resistances of the first and second memory elements 140a, 140b is within a resistive range corresponding to a resistance state "C1+A2" of the memory cell 115. In the illustrated example the resistance of the first memory element 140a is changed to 200 ohms, the resistance of the second memory element 140b stays at 1000 ohms, and thus the total resistance changes to 1,200 ohms.

As shown in FIGS. 3 and 4, applying a third bias arrangement to store a third data value comprising a third voltage pulse having a magnitude V3 across the memory cell 115 establishes a resistance in the first memory element 140a within a resistance range corresponding to the low resistance state "C1". The third bias arrangement establishes a resistance in the second memory element 140b within a resistance range corresponding to a high resistance state "B2". The summation of the resistances of the first and second memory elements 140a, 140b is within a resistive range corresponding to a resistance state "C1+B2" of the memory cell 115. In the illustrated embodiment the resistance of the first memory element 140a is changed to 200 ohms, the resistance of the second memory element 140b is changed to 10,000 ohms, and thus the total resistance changes to 10,200 ohms.

As shown in FIGS. 3 and 4, applying a fourth bias arrangement to store a fourth data value comprising a fourth voltage pulse having a magnitude V4 across the memory cell 115 establishes a resistance in the first memory element 140a within a resistance range corresponding to the low resistance state "C1". The fourth bias arrangement establishes a resistance in the second memory element 140b within a resistance range corresponding to a low resistance state "C2". The summation of the resistances of the first and second memory elements 140a, 140b is within a resistive range corresponding to a resistance state "C1+C2" of the memory cell. In the illustrated embodiment the resistance of the first memory element 140a is changed to 200 ohms, the resistance of the second memory element 140b is changed to 100 ohms, and thus the total resistance changes to 300 ohms.

The different resistive state change behaviors versus applied voltage for the first and second memory elements 140a, 140b results in the memory cell 115 having non-overlapping resistive ranges associated with the various states of the memory cell 115. Since the total resistance of all the memory elements 140 indicates the data value stored in the memory cell 115, this difference in resistive state change behavior for each memory element 140 provides for multi-bit operation to store multiple bits of data.

FIG. 4 illustrates the change in the resistance state of the memory cell from the initial state to one of various programmed states. Additionally, the resistance state of the memory cell can be changed between the various programmed states by using appropriate voltages and pulse widths. For example, applying the second bias arrangement can change the resistance state of the memory cell from the "B1+A2" programmed state to the "C1+A2" programmed state.

FIGS. 3 and 4 illustrate five resistance states (A1+A2, B1+A2, C1+A2, C1+B2, C1+C2) for the memory cell 115 having two memory elements 140 by applying four bias arrangements. As described above, the present invention includes memory cells comprising N memory elements (N>1) with each memory element having a different resistive state change behavior. Thus, for N memory elements the total number of resistive states for the memory cell can be equal to or above 2N+1 and 2N different voltage pulses are needed.

In FIGS. 3 and 4 the resistive state changes are induced by applying bias arrangements of voltage pulses having different voltage magnitudes and the same pulse length. For example, V1 may be 1 V, V2 may be 3.4 V, V3 may be 5 V, V4 may by 6V, and the pulse length may be 80 ns with a rise time of 10 ns and a fall time of 10 ns.

Alternatively, the magnitude of the pulses may be the same and the pulse time changed to induce the state change, for example a voltage of 5 V applied for one of 80 nsec, 200 nsec, 500 nsec, or 2000 nsec can be applied to set the memory cell to the desired resistive state.

Generally, the resistive state changes can be induced by applying unipolar voltage pulses having different voltage magnitudes and/or different pulse widths depending upon the implementation.

Figure 5B:
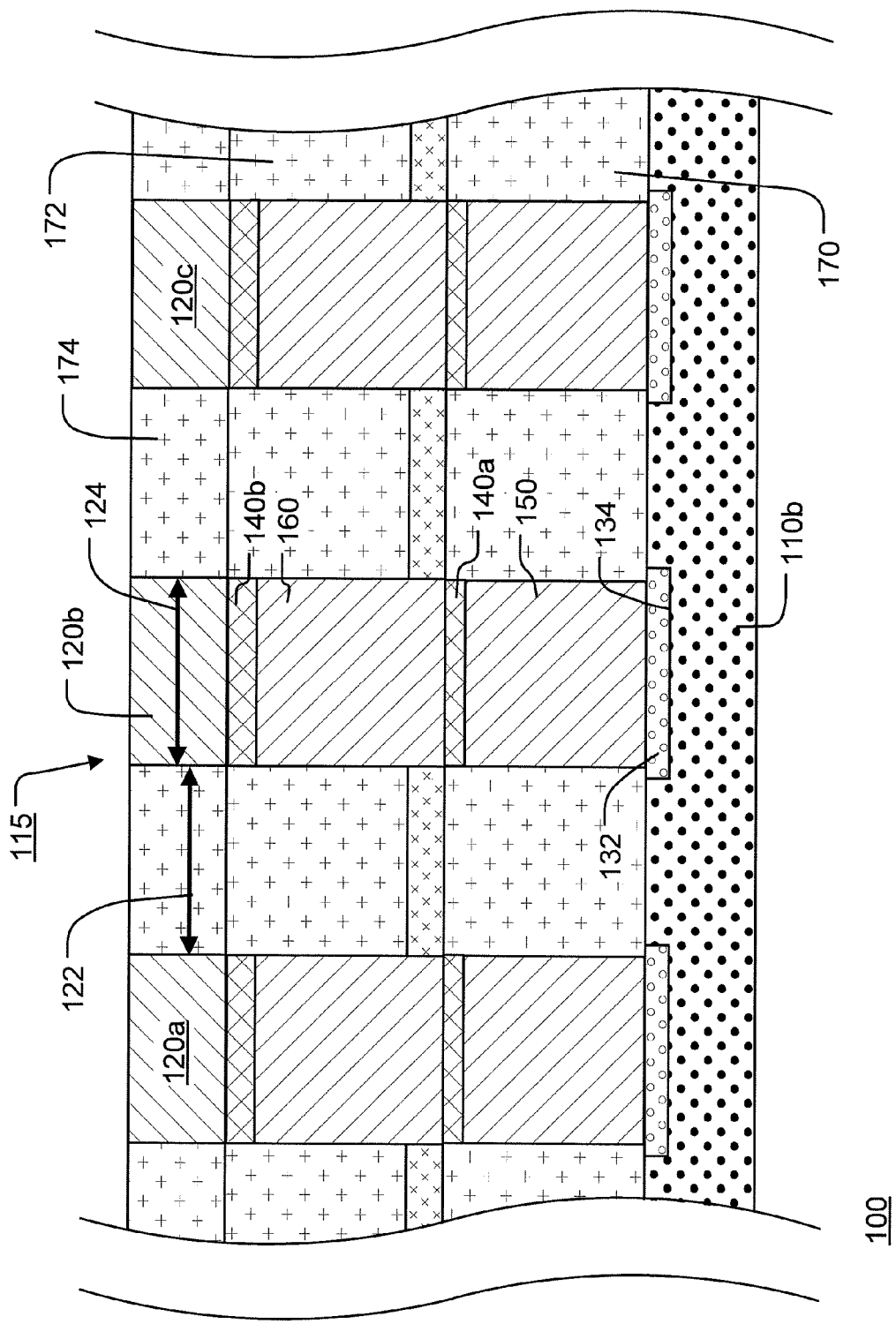

FIGS. 5A and 5B illustrate cross-sectional views of a portion of an embodiment of memory cells (including representative memory cell 115) arranged in the cross-point array 100, FIG. 5A taken along the bit lines 120 and FIG. 5B taken along the word lines 110.

Referring to FIGS. 5A and 5B, the memory cell 115 includes a doped semiconductor region 132 within the word line 110b. The word lines 110 comprise doped semiconductor material having a conductivity type opposite that of the doped semiconductor region 132. Thus, the doped semiconductor region 132 and the word line 110b define a pn junction 134 therebetween, and the diode 130 comprises the doped semiconductor region 132 and a portion of the word line 110b adjacent the doped semiconductor region 132. In the illustrated embodiment the word lines 110 comprise doped P-type semiconductor material such as polysilicon, and the doped semiconductor region 132 comprises doped N-type semiconductor material.

In an alternative embodiment the word lines 130 may comprise other conductive materials such as W, TiN, TaN, Al and the diode may be formed by first and second doped regions having different conductivity types on the word lines 110. In yet another alternative embodiment, the diode may be formed by a lightly doped region between more highly doped regions of opposite conductivity since it has been observed that the breakdown voltage of the diode can be improved.

The memory cell 115 includes a first conductive element 150 comprising tungsten extending through dielectric 170 to couple the diode 130 to a first memory element 140a, and a second conductive element 160 comprising tungsten extending through dielectrics 173, 172 to couple the first memory element 140a to the second memory element 140b. As described in more detail below, the dielectrics 173, 172 preferably comprise material which can be selectively processed (e.g. selectively etched) relative to one another. Alternatively, dielectric 173 may be omitted.

The memory elements 140a, 140b comprise one or more tungsten-oxygen compounds $WO_x$, for example one or more of $WO_3$, $W_2O_5$, and $WO_2$. The first memory element 140a is self-aligned with the first conductive plug 150, and the second memory element 140b is self-aligned with the second conductive plug 160. In alternative embodiments the memory elements 140a, 140b may comprise one or more of NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, and $(BaSr)TiO_3$.

Figure 5C:
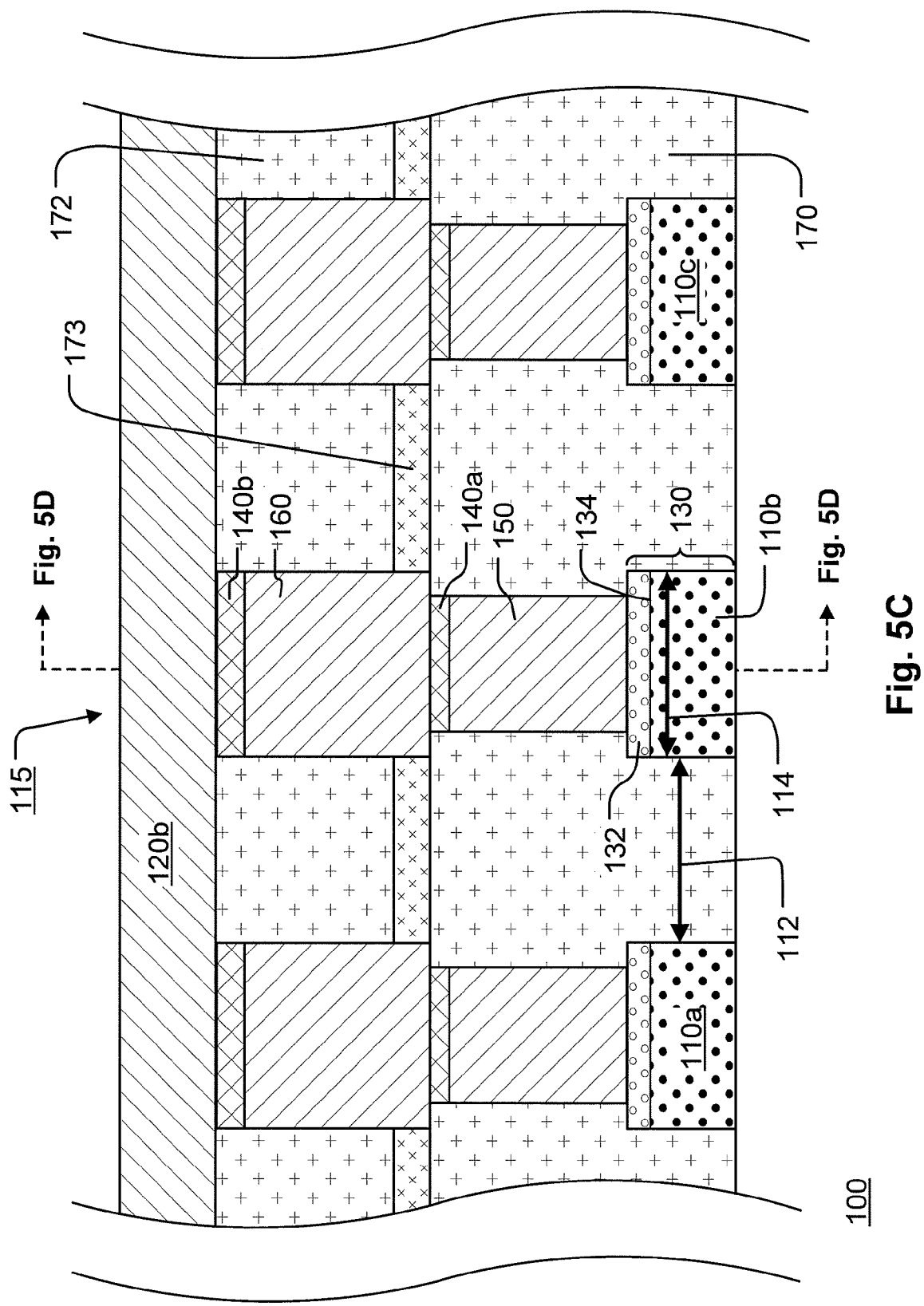
FIGS. 5C-5D illustrate cross-sectional views of a portion of a second embodiment of memory cells arranged in the cross-point array.
Figure 5D:
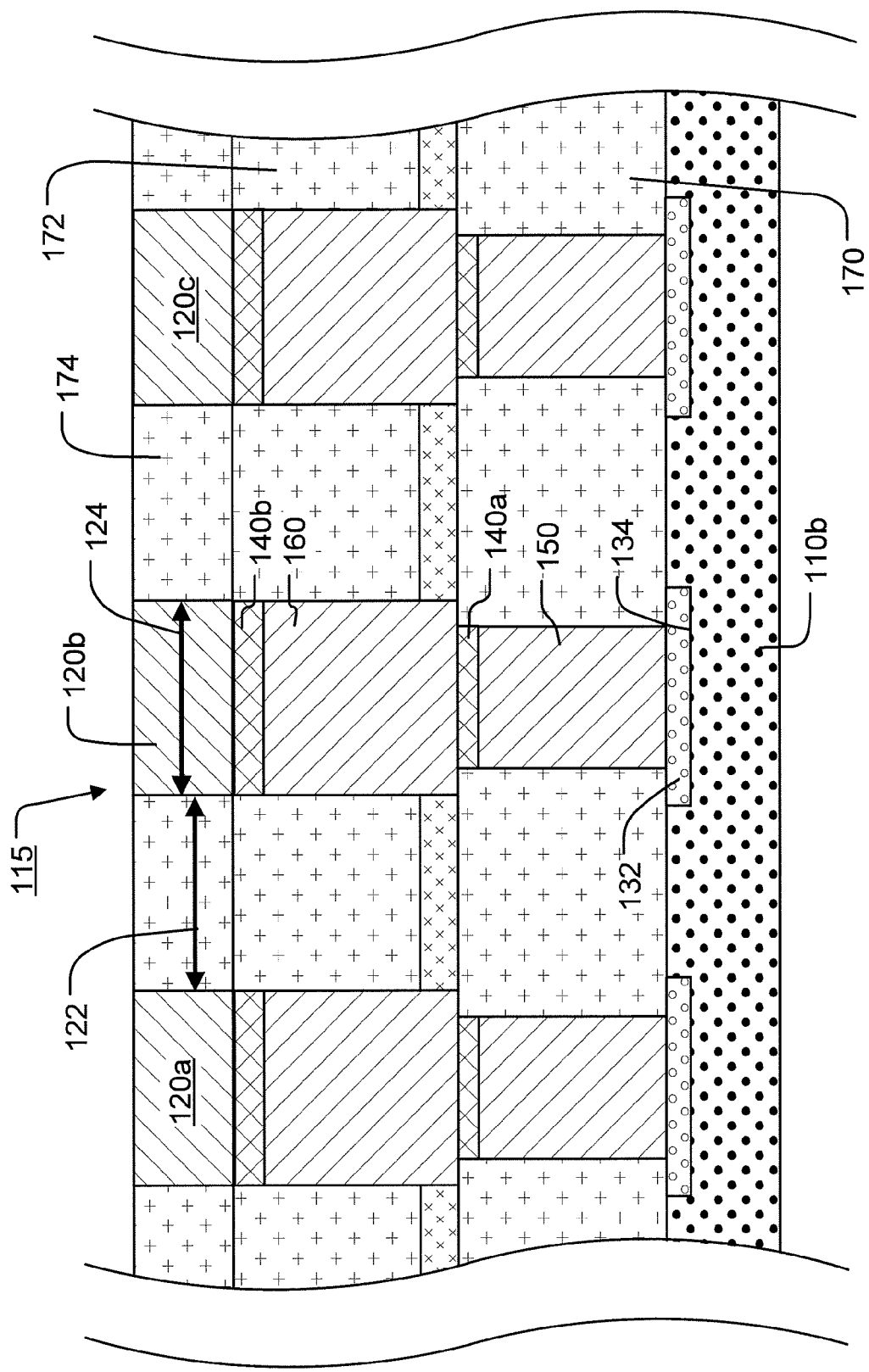

The first memory element 140a and the second memory element 140b are manufactured such that the elements 140a, 140b have different resistive state change behaviors, allowing the memory cell 115 to perform multi-level operation and store multi-bit data value. In embodiments the first and second memory elements 140a, 140b may be formed by an oxidation process of first and second plugs 150, 160 respectively, and the different resistive state change behaviors can be obtained using different oxidation times and/or different oxidation partial pressure for the respective oxidation processes used to manufacture the first and second memory elements 140a, 140b. In embodiments in which the first and second memory elements 140a, 140b are manufactured using the same conditions, the different resistive state change behaviors can be implemented by the first and second memory elements 140a, 140b having different widths (which in some embodiments are diameters) as illustrated in FIGS. 5C and 5D.

The bit lines 120, including bit line 120b acting as a top electrode for the memory cell 115, are electrically coupled to the second memory elements 140b and extend into and out of the cross-section illustrated in FIG. 5B. The bit lines 120 comprise one or more layers of conductive material. For example, the bit lines 120 may comprise Ti, W, Mo, Al, Ta, Cu, Pt, Ir, La, Ni, N, O, and Ru and combinations thereof.

Dielectric 174 separates adjacent bit lines 120. In the illustrated embodiment the dielectrics 170, 172, and 174 comprise silicon oxide, and dielectric 173 comprises silicon nitride. Alternatively, other dielectric materials may be used.

In operation, bias circuitry (See, for example, biasing arrangement supply voltages, current sources 36 of FIG. 14) coupled to the corresponding word line 110b and bit line 120b to apply bias arrangements across the memory cell 115 can induce a programmable change in one or more of the memory elements 140, the total electrical resistance of the memory elements 140 indicating the data value stored in the memory cell 115.

As can be seen in the cross-sections illustrated in FIGS. 5A and 5B, the memory cells of the array 100 are arranged at the cross-point locations of the word lines 110 and bit lines 120. Memory cell 115 is representative and is arranged at the cross-point location of word line 110b and bit line 120b. Additionally, the memory elements 140 and conductive elements 150, 160 have a first width substantially the same as the width 114 of the word lines 110 (See FIG. 5A). Furthermore, the memory elements 140 and conductive elements 150, 160 have a second width substantially the same as the width 124 of the bit lines 120 (See FIG. 5B). As used herein, the term "substantially" is intended to accommodate manufacturing tolerances. Therefore, the cross-sectional area of the memory cells of array 100 is determined entirely by dimensions of the word lines 110 and bit lines 120, allowing for a high memory density for array 100.

The word lines 110 have word line widths 114 and adjacent word lines 110 are separated by a word line separation distance 112 (See FIG. 5A), and the bit lines 120 have bit line widths 124 and adjacent bit lines 120 are separated by a bit line separation distance 122 (See FIG. 5B). In preferred embodiments the summation of the word line width 114 and the word line separation distance 112 is equal to twice a feature size F of a process used to form the array 100, and the summation of the bit line width 124 and the bit line separation distance 122 is equal to twice the feature size F. Additionally, F is preferably a minimum feature size for a process (typically a lithographic process) used to form the bit lines 120 and word lines 110, such that the memory cells of array 100 have a memory cell area of 4 $F^2$.

In the memory array 100 illustrated in FIGS. 5A-5B, the first memory element 140a is self-aligned with the conductive plug 150, and the second memory element 140b is self-aligned with the conductive plug 160. In the manufacturing embodiment described in more detail below, the memory elements 140 are formed by oxidation of the tungsten material of the plugs 150, 160.

Figure 6:
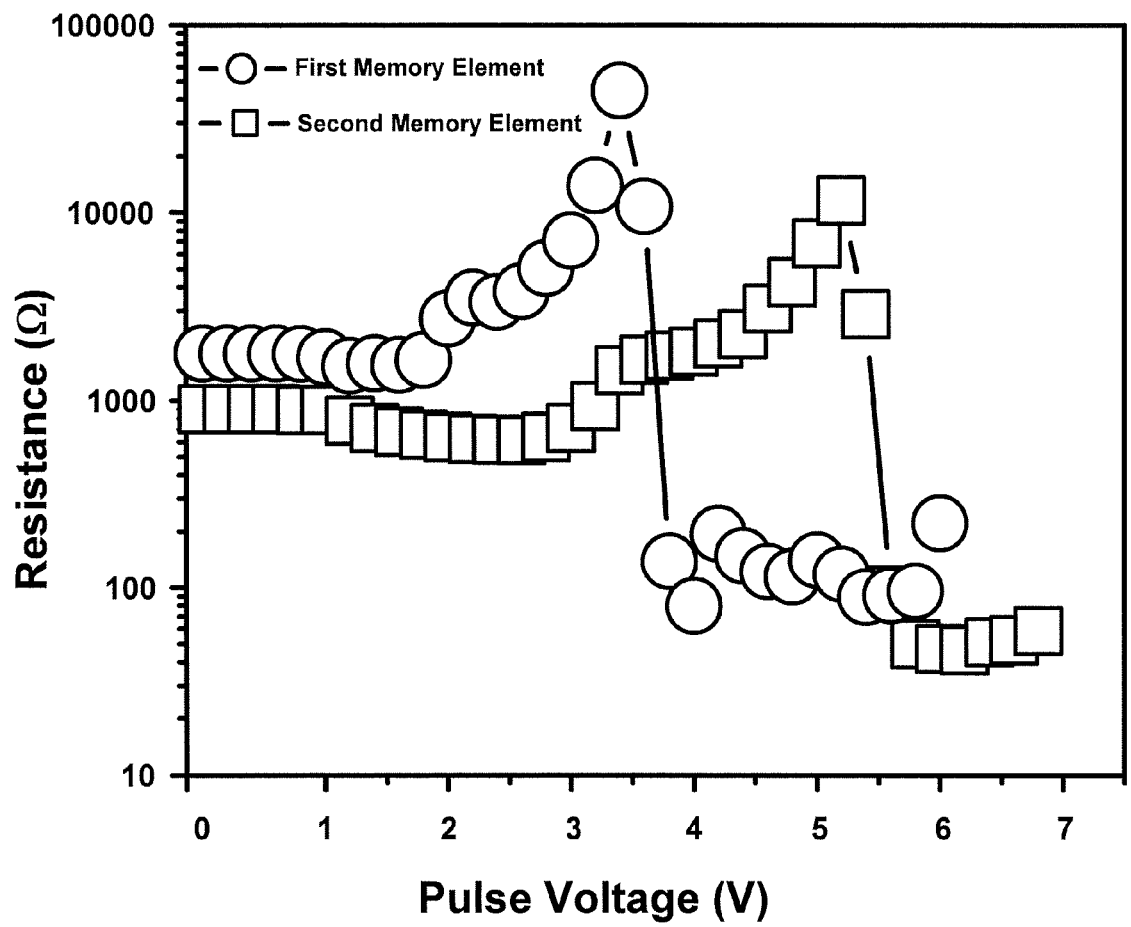
FIG. 6 illustrates measured data of the resistive state change behavior of first and second memory elements of the memory cell.

FIG. 6 illustrates measured data of the resistive state change behavior of the first and second memory elements 140a, 140b of the memory cell 115 each comprising one or more tungsten-oxygen compounds such as $WO_3$, $W_2O_5$, and $WO_2$. Additionally, the table below summarizes the measured resistive change of the first and second memory elements 140a, 140b as illustrated in FIG. 6 for various applied voltages, as well as the corresponding change in the total resistance of the memory cell.

|  | R@initial | R@3.4 V | R@4.4 V | R@5.2 V | R@6 V |
| --- | --- | --- | --- | --- | --- |
| First Element | 1689 | 44642 | 147 | 117 | 221 |
| Second Element | 884 | 1440 | 2247 | 11614 | 47 |
| Total | 2573 | 45782 | 2394 | 11731 | 268 |

The first memory element 140a has an initial resistance of 1689 ohms and the second memory element 140b has an initial resistance of 884 ohms, and thus the total resistance is 2573 ohms.

Applying a first voltage pulse with a magnitude of 3.4 V and a pulse time of 80 ns between the word line 110b and bit line 120b induces a resistive state change in the first memory element 140a from a resistance of 1689 ohms to 44,642 ohms. The first voltage pulse also induces a change in the resistance of the second memory element 140b from 884 ohms to 1440 ohms. However, the resistance of the second memory element 140b after the first voltage pulse is still within the resistive range associated with the initial state of the second memory element 140b. Therefore, the first voltage pulse does not induce a change in the resistive state of the second memory element 140b as used herein.

Applying a second voltage pulse with a magnitude of 4.4 V and a pulse time of 80 ns between the word line 110b and bit line 120b induces a resistive state change in the first memory element 140a from a resistance of 1689 ohms to 147 ohms. The second voltage pulse also induces a change in the resistance of the second memory element 140b from 884 ohms to 2247 ohms. However, the resistance of the second memory element 140b after the second voltage pulse is still within the resistive range associated with the initial state of the second memory element 140b. Therefore, the second voltage pulse does not induce a change in the resistive state of the second memory element 140b as used herein.

Applying a third voltage pulse with a magnitude of 5.2 V and a pulse time of 80 ns between the word line 110b and bit line 120b induces a resistive state change in the first memory element 140a from a resistance of 1689 ohms to 117 ohms. The third voltage pulse also induces a resistive state change in the second memory element 140b from a resistance of 884 ohms to 11,614 ohms.

Applying a fourth voltage pulse with a magnitude of 6.0 V and a pulse time of 80 ns between the word line 110b and bit line 120b induces a resistive state change in the first memory element 140a from a resistance of 1689 ohms to 221 ohms. The fourth voltage pulse also induces a resistive state change in the second memory element 140b from a resistance of 884 ohms to 47 ohms.

The different resistive state change behaviors versus applied voltage for the first and second memory elements 140a, 140b results in the memory cell 115 having non-overlapping total resistance resistive ranges associated with the states of the memory cell 115. Since the total resistance of all the memory elements 140 indicates the data value stored in the memory cell 115, this difference in resistive state change behavior for each memory element 140 allows the memory cell 115 to store multiple bits of data. In FIG. 6 the memory cell is described as having five different resistive states, although it can be seen that more than five different resistive states can be obtained by careful selection of additional bias arrangements.

In the embodiment illustrated in FIGS. 5A-5B each memory cell has two memory elements 140a, 140b. However, the present invention is not limited to such and includes memory cells having two or more memory elements.

FIGS. 7-13 illustrate steps in a fabrication sequence for manufacturing the cross-point array 100 of memory cells as illustrated in FIGS. 5A-5B.

Figure 7B:
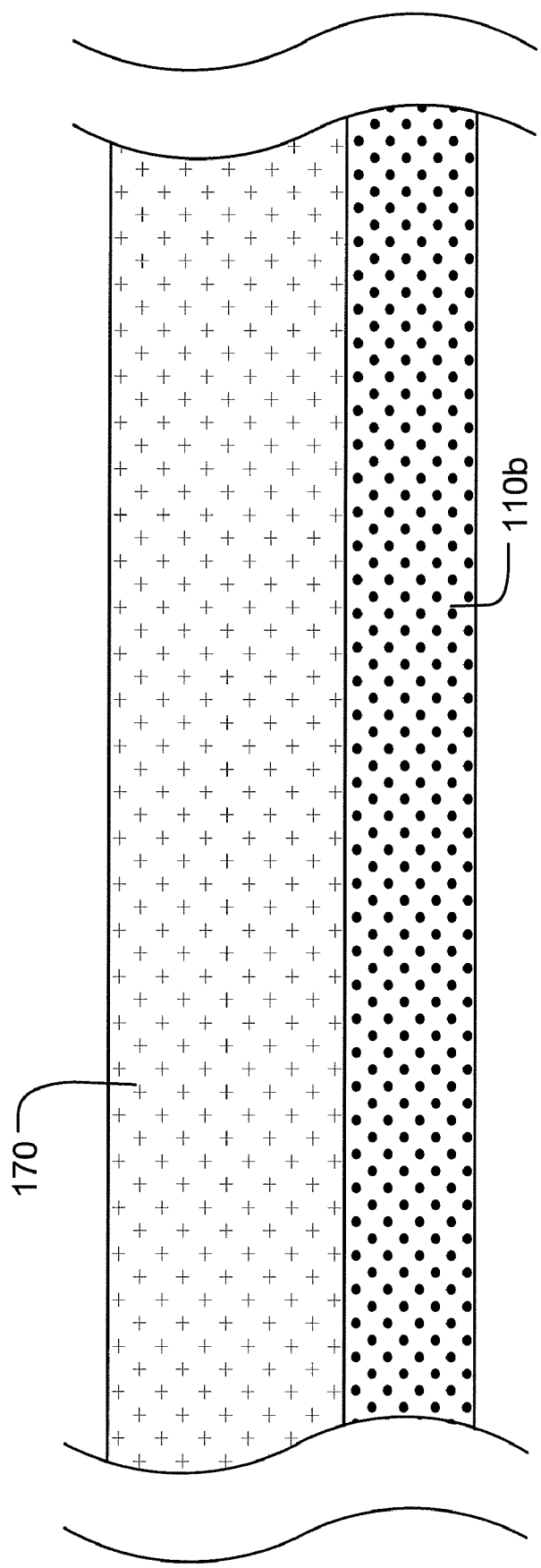
FIG. 7-13 illustrate steps in a fabrication sequence for manufacturing the cross-point array of memory cells as illustrated in FIGS. 5A-5B.

FIGS. 7A-7B illustrate cross-sectional views of a first step of forming word lines 110 on a substrate and dielectric 170 on the word lines 110. The word lines 110 extend in a first direction into and out of the cross-section illustrated in FIG. 7A, and in the illustrated embodiment comprise doped semiconductor material. The word lines 110 have word line width 114 and adjacent word lines are separated by word line separation distance 112.

Figure 8B:
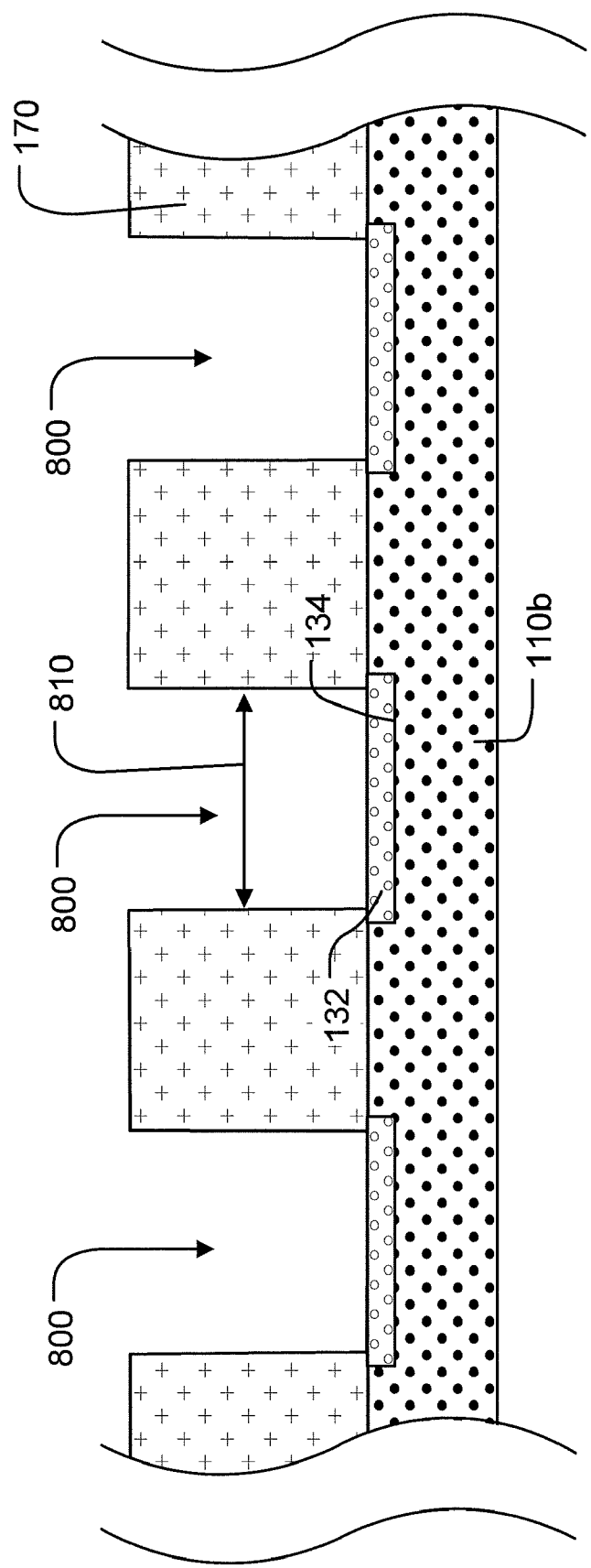

Next, an array of first vias 800 having width 810 are formed in the dielectric 170 to expose portions of the word lines 110, and the doped semiconductor regions 132 are formed within the word lines 110, for example by ion implantation, resulting in the structure illustrated in the cross-sectional views of FIGS. 8A-8B. The doped semiconductor regions 132 have a conductivity opposite that of the word lines 110, and thus the doped semiconductor regions 132 and word lines 110 define pn junctions 134, and thus diode 130 comprises the doped semiconductor regions 132 and a portion of the word line 110 adjacent the doped semiconductor regions 132.

Figure 9A:
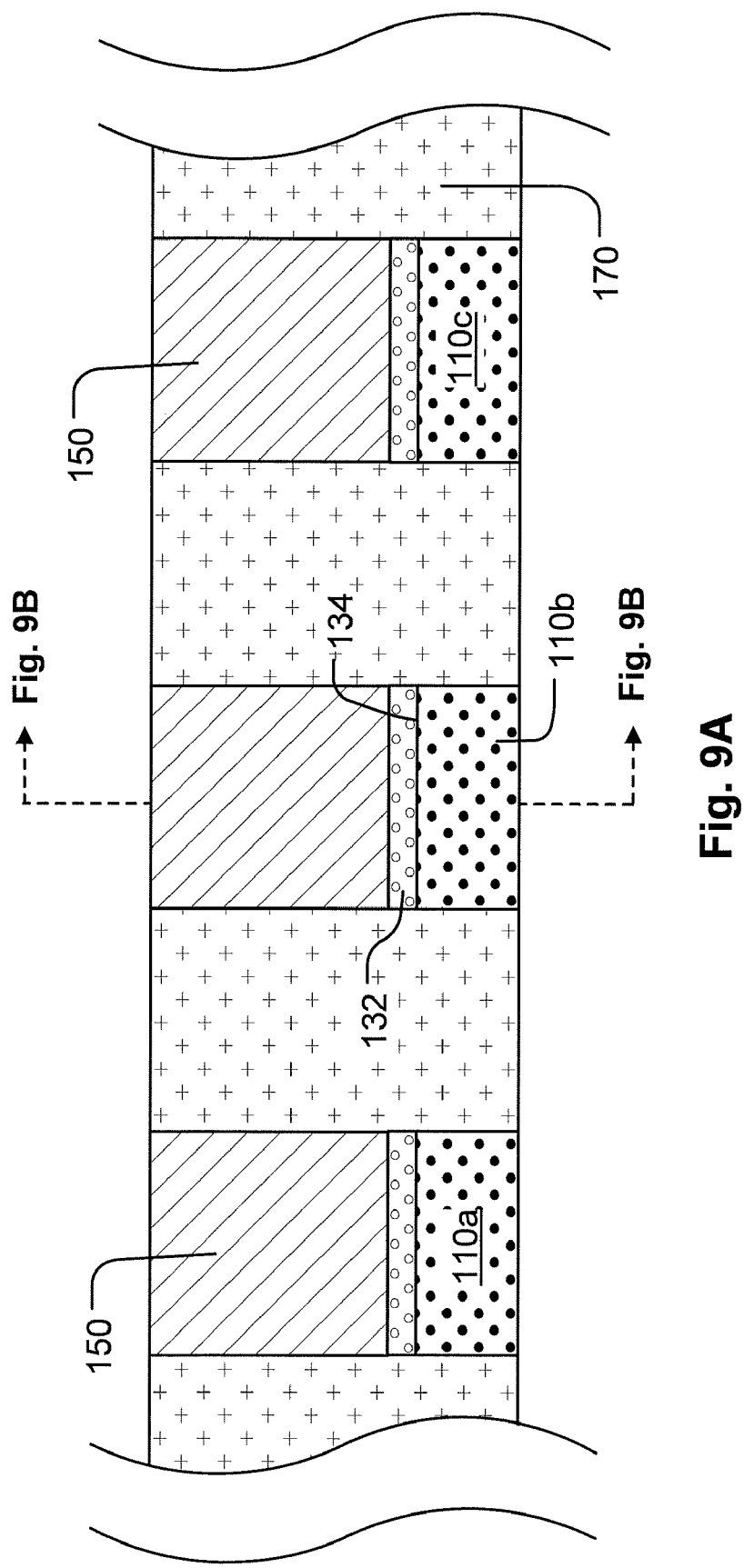
Figure 9B:
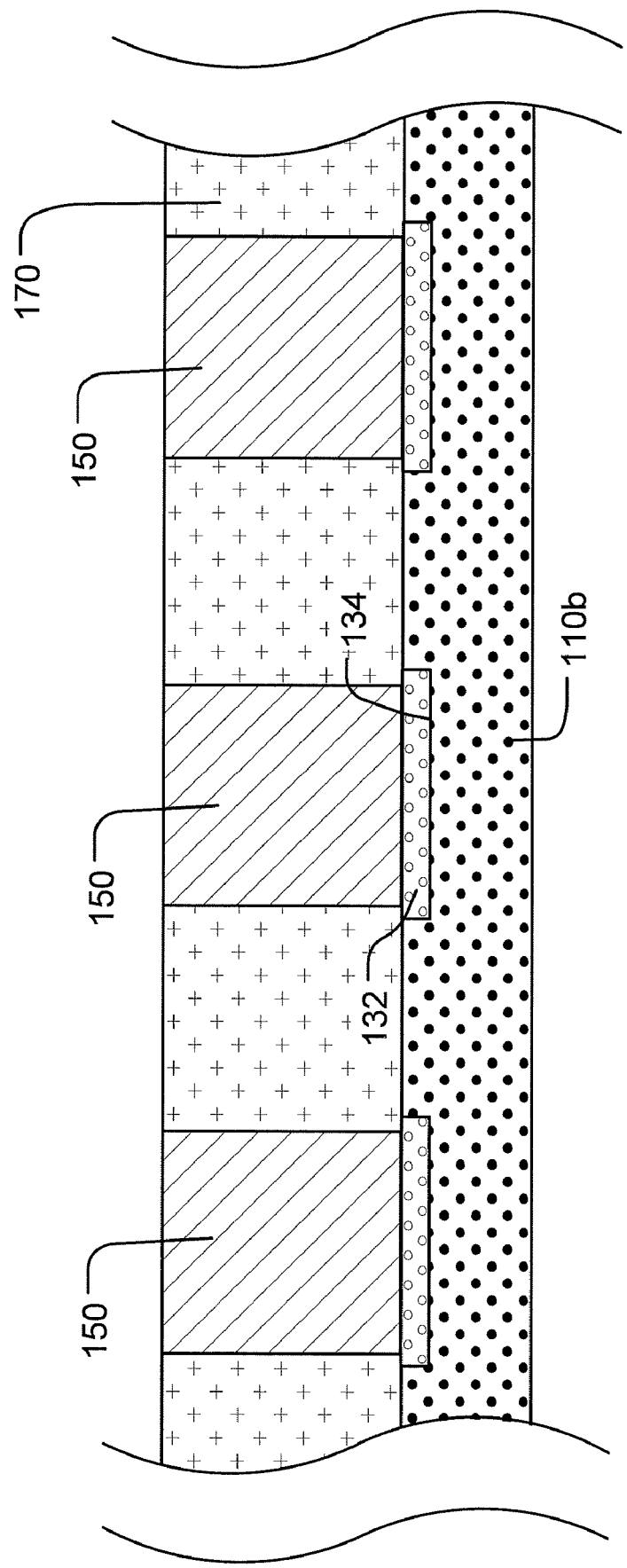

Next, first conductive elements 150 comprising tungsten are formed within the first vias 800 of FIGS. 8A-8B, resulting in the structure illustrated in the cross-sectional views of FIGS. 9A-9B. The tungsten plugs 150 can be formed within the vias 800 by Chemical Vapor Deposition CVD of tungsten material, followed by a planarization step such as Chemical Mechanical Polishing CMP.

Figure 10B:
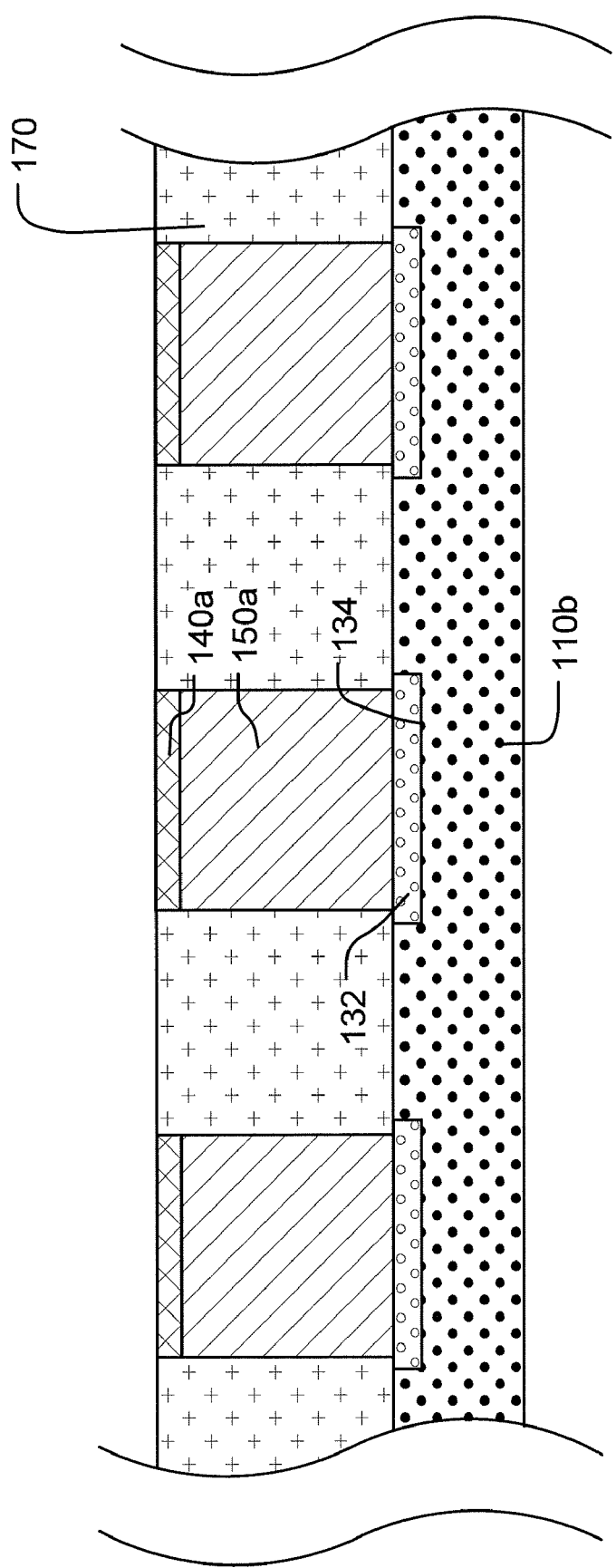

Next, oxidation of a portion of the tungsten plugs 150 forms first memory elements 140a self-aligned with the remaining portion of the corresponding conductive elements 150, resulting in the structure illustrated in the cross-sectional views of FIGS. 10A and 10B. The oxidation can comprise plasma oxidation and an optional thermal oxidation step. For example, direct oxygen plasma oxidation or downstream oxygen plasma oxidation may be used. Embodiments include pure $O_2$ gas chemistry, or mixed chemistries such as $O_2/N_2$ or $O_2/N_2/H_2$. Since the memory elements 140a are formed by oxidation of the plugs 150, no additional masks are necessary to form the memory elements 140a.

Figure 11A:
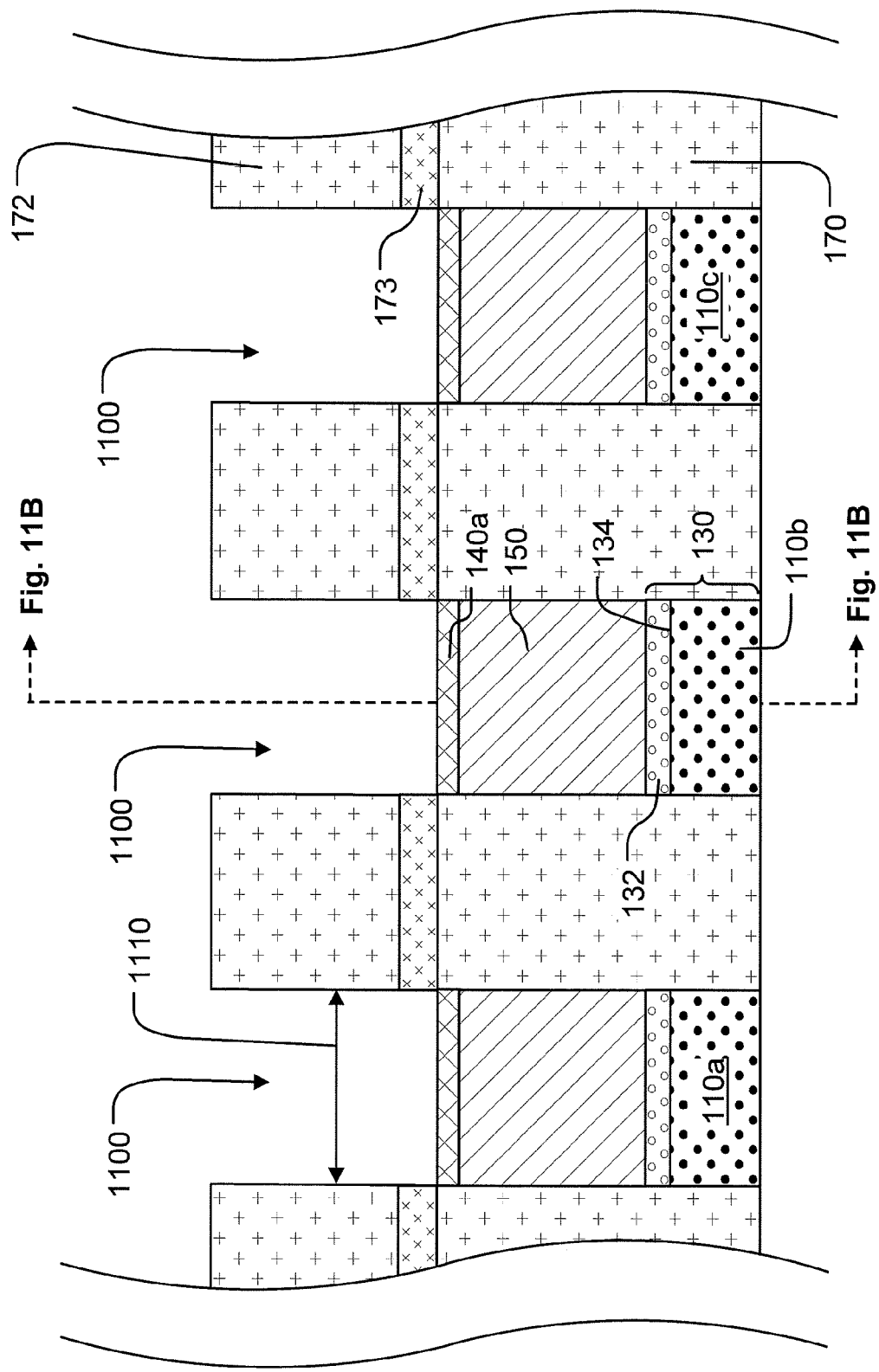
Figure 11B:
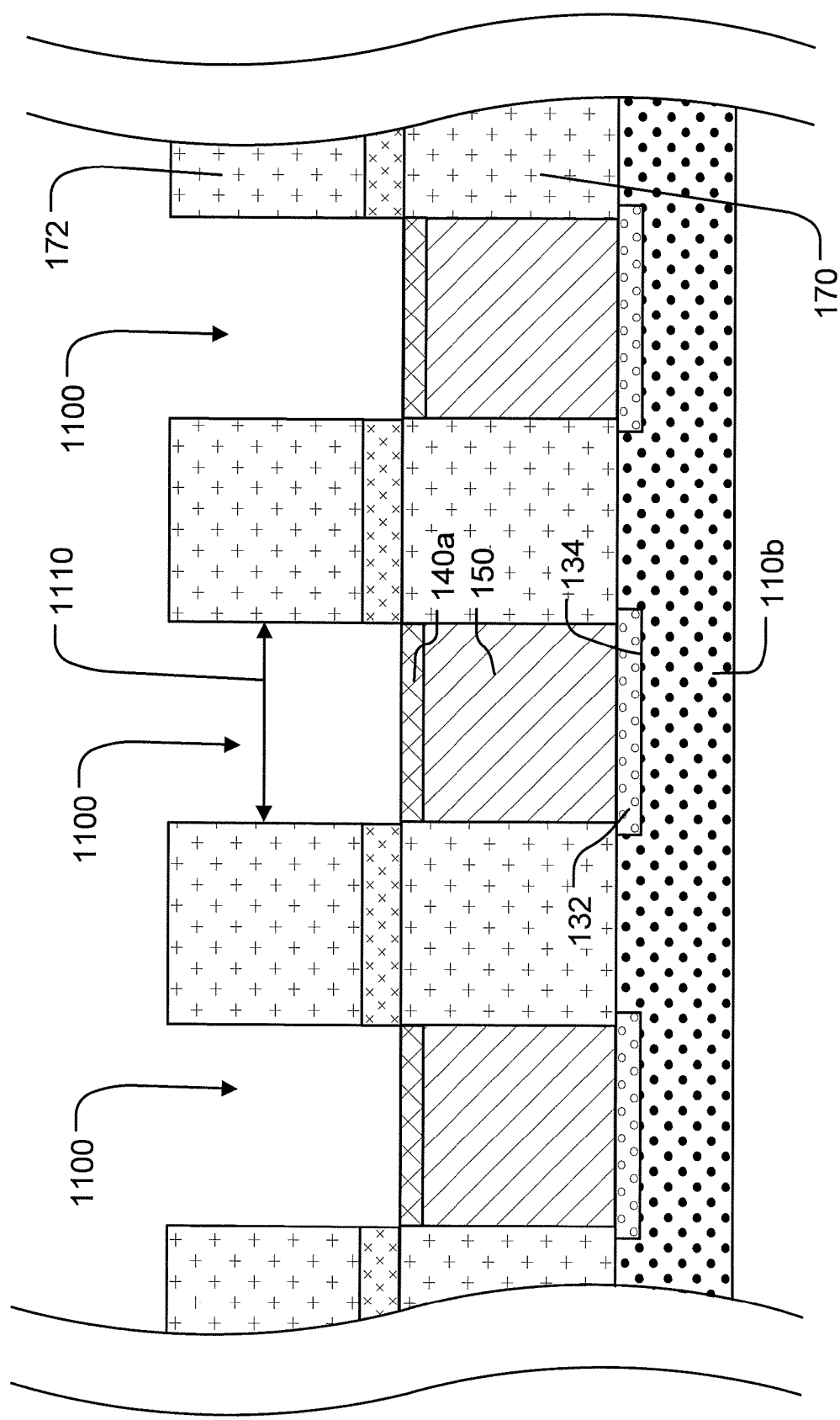

Next, dielectric 173 is formed on the structure illustrated in FIGS. 10A-10B, dielectric 172 is formed on dielectric 173, and an array of second vias 1100 having a width or diameter 1110 are formed in the dielectrics 173, 172 to expose top surfaces of the first memory elements 140a, resulting in the structure illustrated in the cross-sectional views of FIGS. 11A-11B.

The vias 1100 may be formed by selectively etching through dielectric 172 (comprising for example silicon oxide) and using dielectric 173 (comprising for example silicon nitride) as an etch stop, and then selectively etching through dielectric 173 to expose top surfaces of the first memory elements 140. In such an embodiment dielectric 173 acts as a borderless etch stop and improves the process window for the via 1100. In some alternative embodiments dielectric 173 may be omitted.

Figure 12B:
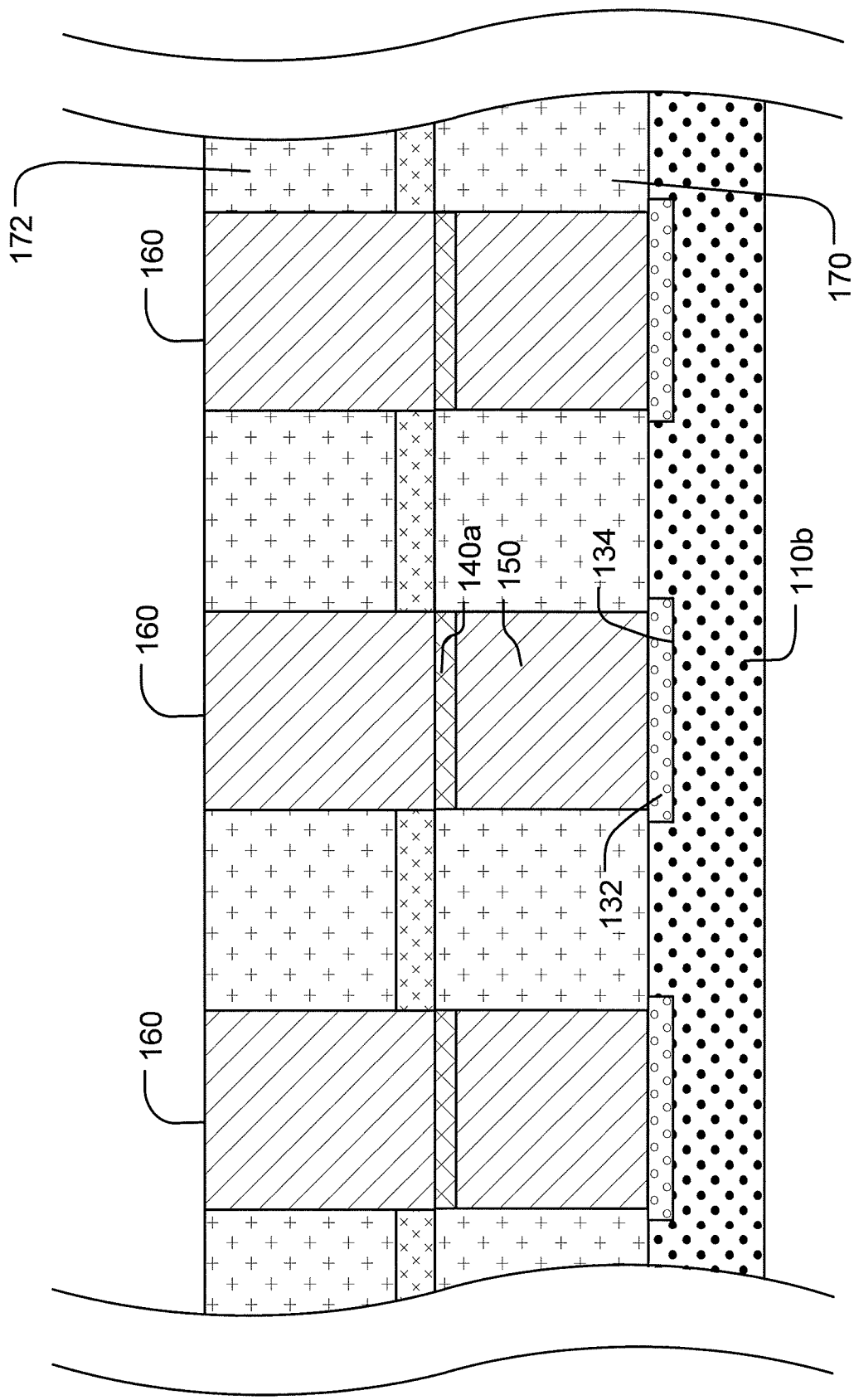

Next, second conductive elements 160 comprising tungsten are formed within the vias 1100 of FIGS. 11A-11B, resulting in the structure illustrated in the cross-sectional views of FIGS. 12A-12B. The second conductive elements 160 can be formed within the vias 1100 by Chemical Vapor Deposition CVD of tungsten on the structure of FIGS. 11A-11B, followed by a planarization step such as Chemical Mechanical Polishing CMP.

Figure 13A:
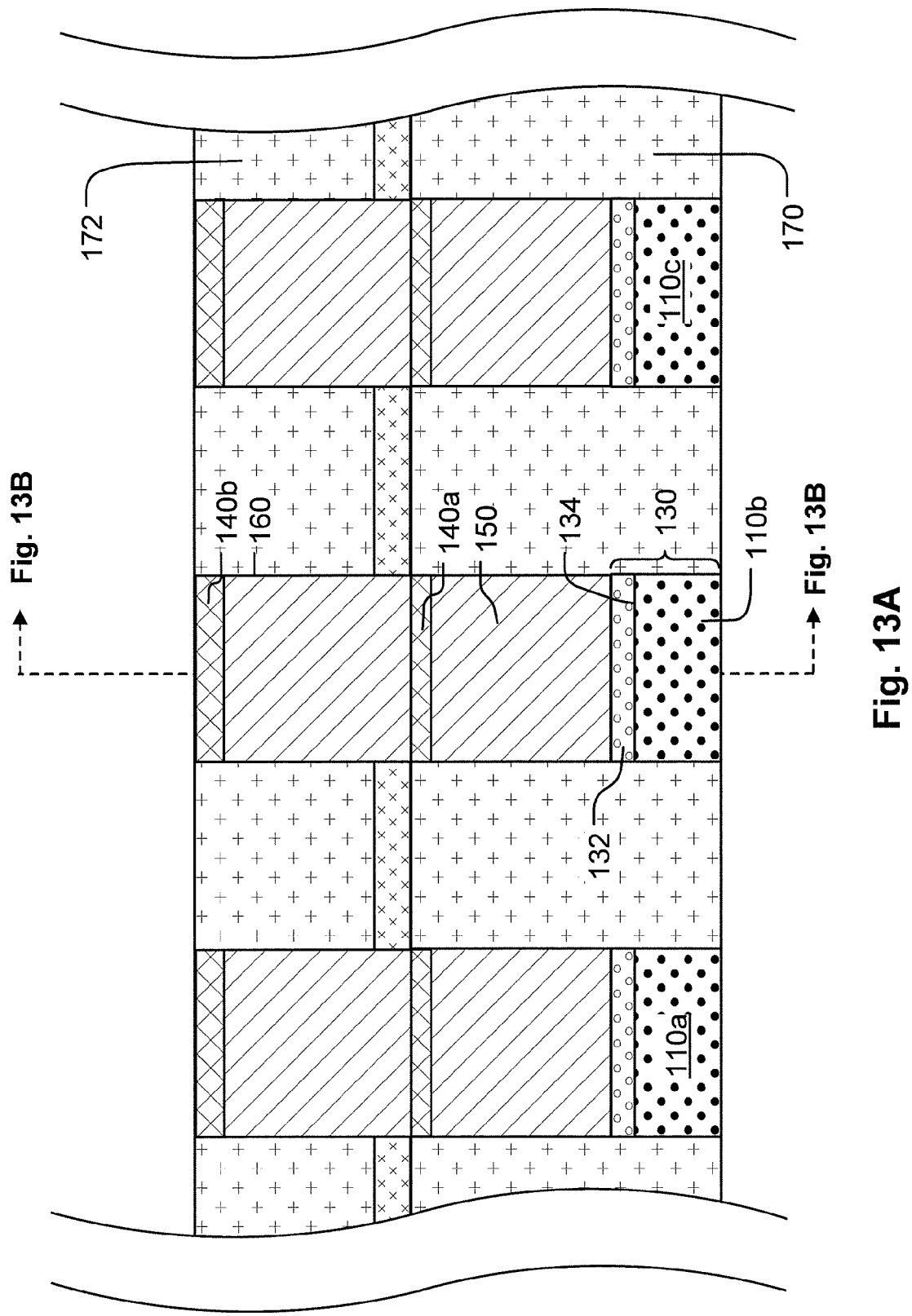
Figure 13B:
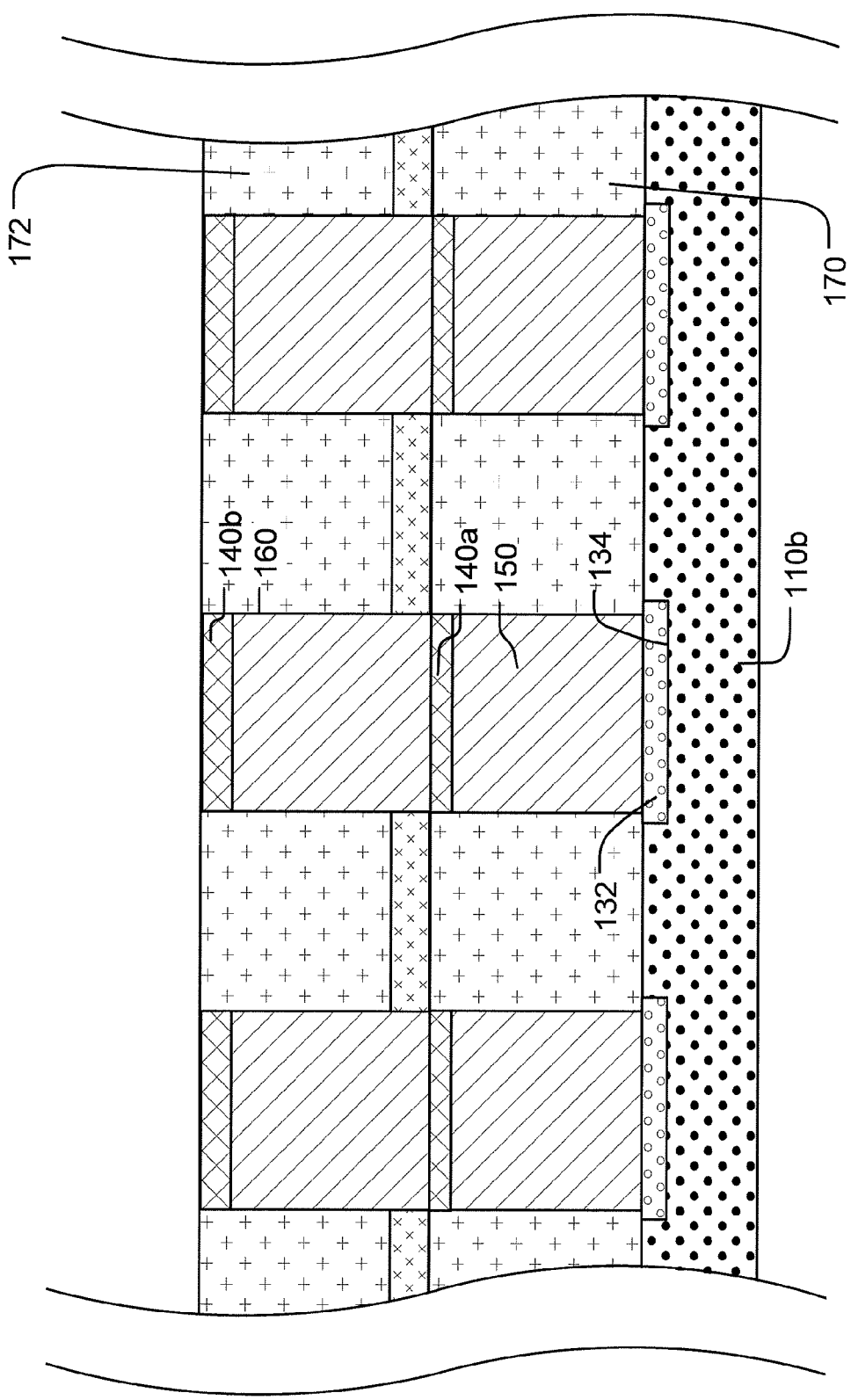

Next, oxidation of a portion of the conductive elements 160 forms second memory elements 140b self-aligned with the remaining portion of the conductive elements 160, resulting in the structure illustrated in the cross-sectional views of FIGS. 13A and 13B. The oxidation can comprise plasma oxidation and an optional thermal oxidation step. For example, direct oxygen plasma oxidation or downstream oxygen plasma oxidation may be used. Embodiments include pure $O_2$ gas chemistry, or mixed chemistries such as $O_2/N_2$ or $O_2/N_2/H_2$. Since the memory elements 140b are formed by oxidation of the plugs 160, no additional masks are necessary to form the memory elements 140b. The different resistive state change behaviors can be obtained for the first and second memory elements 140a, 140b using different oxidation times and/or different oxidation partial pressure for the respective oxidation processes used to manufacture the first and second memory elements 140a, 140b. In an alternative embodiment the different resistive state change behaviors can be implemented by the vias 800 and 1110 having different widths 810, 1110 such that the first and second memory elements 140a, 140b having different widths. For example, the width 810 of the vias 800 can be sublithographic in some embodiments.

Next, bit lines 130 separated by dielectric 174 are formed on the structure illustrated in FIGS. 13A-13B, resulting in the cross-point array 100 illustrated in FIGS. 5A-5B. The bit lines 130 and dielectric 174 may be formed by patterning a bit line material on the structure in FIGS. 13A-13B, forming dielectric on the bit lines 130, and performing a planarizing process such as Chemical Mechanical Polishing CMP.

FIG. 14 is a simplified block diagram of an integrated circuit 10 including a cross-point memory array 100 of memory cells having a plurality of metal-oxide based memory elements and diode access devices as described herein. A word line decoder 14 is coupled to and in electrical communication with a plurality of word lines 16. A bit line (column) decoder 18 is in electrical communication with a plurality of bit lines 20 to read data from, and write data to, the memory cells (not shown) in array 100. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a plurality of word lines;
a plurality of bit lines; and
a plurality of memory cells located between the word lines and bit lines, each memory cell comprising:
a diode; and
a plurality of memory elements each comprising one or more metal-oxygen compounds, the diode and the plurality of memory elements arranged in electrical series along a current path between a corresponding word line in the plurality of word lines and a corresponding bit line in the plurality of bit lines.

2. The memory device of claim 1, wherein:
the bit lines overly the word lines and cross over the word lines at cross-point locations; and
the memory cells are arranged at the cross-point locations.

3. The memory device of claim 1, wherein the one or more metal-oxygen compounds comprise at least one of tungsten-oxide ($WO_x$), NiO, $Nb_2O_5$, $CuO_2$, $Ta_2O_5$, $Al_2O_5$, CoO, $Fe_2O_3$, $HfO_2$, $TiO_2$, $SrTiO_3$, $SrZrO_3$, and $(BaSr)TiO_3$.

4. The memory device of claim 1, wherein:
the word lines comprise doped semiconductor material having a first conductivity type; and
the diode of each memory cell comprises a doped semiconductor region within the corresponding word line and a portion of the corresponding word line adjacent the doped semiconductor region, the doped semiconductor region having a second conductivity type opposite the first conductivity type.

5. The memory device of claim 1, wherein each memory cell further comprises:
a first conductive element on the diode and electrically coupling the diode to a first memory element in the plurality of memory elements; and
a second conductive element overlying the first memory element and electrically coupling the first memory element to a second memory element in the plurality of memory elements.

6. The memory device of claim 5, wherein:
the first and second conductive elements comprise tungsten;
the first memory element is aligned with the first conductive element; and
the second memory element is aligned with the second conductive element.

7. The memory device of claim 5, wherein the corresponding bit line overlies the second conductive element.

8. A memory device comprising:
a plurality of word lines;
a plurality of bit lines; and
a plurality of memory cells located between the word lines and bit lines, each memory cell comprising:
a diode; and
a plurality of memory elements each comprising one or more metal-oxygen compounds, the diode and the plurality of memory elements arranged in electrical series along a current path between a corresponding word line in the plurality of word lines and a corresponding bit line in the plurality of bit lines, wherein:
the word lines have word line widths and adjacent word lines are separated by a word line separation distance;
the bit lines have bit line widths and adjacent bit lines are separated by a bit line separation distance; and
each of the memory cells in the plurality of memory cells have a memory cell area, the memory cell area having a first side along the first direction and a second side along the second direction, the first side having a length equal to the summation of the bit line width and the bit line separation distance, the second side having a length equal to the summation of the word line width and the word line separation distance.

9. The memory device of claim 8, wherein the length of the first side is equal to twice a feature size F, and the length of the second side is equal to twice the feature size F, such that the memory cell area is equal to 4 $F^2$.

10. The memory device of claim 1, further comprising bias circuitry adapted to apply bias arrangements across the series arrangement of the diode and the plurality of memory elements of a selected memory cell in the plurality of memory cells to store a multi-bit data value in the selected memory cell, the bias arrangements including:
   a first bias arrangement to establish a high resistance state in a first memory element in the plurality of memory elements and an initial resistance state in a second memory element in the plurality of memory elements to store a first data value of the multi-bit data value in the selected memory cell; and
   a second bias arrangement to establish a low resistance state in the first memory element and the initial resistance state in the second memory element to store a second data value of the multi-bit data value in the selected memory cell.

11. The memory device of claim 10, wherein:
   the first bias arrangement adapted to change the resistance state of the first memory element from an initial resistance state to the high resistance state, and maintain the initial resistance state of the second memory element; and
   the second bias arrangement adapted to change the resistance state of the first memory element from one of the initial and the high resistance states to the low resistance state, and maintain the initial resistance state of the second memory element.

12. The memory device of claim 10, the bias arrangements including:
   a third bias arrangement to establish a low resistance state in the first memory element and a high resistance state in the second memory element to store a third data value of the multi-bit data value in the selected memory cell; and
   a fourth bias arrangement to establish a low resistance state in the first memory element and a low resistance state in the second memory element to store a fourth data value of the multi-bit data value in the selected memory cell.

13. A method for manufacturing a memory device, the method comprising:
   forming a plurality of word lines;
   forming a plurality of bit lines; and
   forming a plurality of memory cells located between the word lines and bit lines, each memory cell comprising:
      a diode; and
      a plurality of memory elements each comprising one or more metal-oxygen compounds, the diode and the plurality of memory elements arranged in electrical series along a current path between a corresponding word line in the plurality of word lines and a corresponding bit line in the plurality of bit lines.

14. The method of claim 13, wherein:
   the bit lines overly the word lines and cross over the word lines at cross-point locations; and
   the memory cells are arranged at the cross-point locations.

15. The method of claim 13, wherein the one or more metal-oxygen compounds comprise at least one of tungsten-oxide ($WO_x$), NiO, $Nb_2O_5$, $CuO_2$, $Ta_2O_5$, $Al_2O_5$, CoO, $Fe_2O_3$, $HfO_2$, $TiO_2$, $SrTiO_3$, $SrZrO_3$, and $(BaSr)TiO_3$.

16. The method of claim 13, wherein:
   the word lines comprise doped semiconductor material having a first conductivity type; and
   the diode of each memory cell comprises a doped semiconductor region within the corresponding word line and a portion of the corresponding word line adjacent the doped semiconductor region, the doped semiconductor region having a second conductivity type opposite the first conductivity type.

17. The method of claim 13, wherein each memory cell further comprises:
   a first conductive element on the diode and electrically coupling the diode to a first memory element in the plurality of memory elements; and
   a second conductive element on the first memory element and electrically coupling the first memory element to a second memory element in the plurality of memory elements.

18. The method of claim 17, wherein:
   the first and second conductive elements comprise tungsten;
   the first memory element is aligned with the first conductive element; and
   the second memory element is aligned with the second conductive element.

19. The method of claim 17, wherein the corresponding bit line is on the second conductive element.

20. A method for manufacturing a memory device, the method comprising:
   forming a plurality of word lines;
   forming a plurality of bit lines; and
   forming a plurality of memory cells located between the word lines and bit lines, each memory cell comprising:
      a diode; and
      a plurality of memory elements each comprising one or more metal-oxygen compounds, the diode and the plurality of memory elements arranged in electrical series along a current path between a corresponding word line in the plurality of word lines and a corresponding bit line in the plurality of bit lines, wherein:
   the word lines have word line widths and adjacent word lines are separated by a word line separation distance;
   the bit lines have bit line widths and adjacent bit lines are separated by a bit line separation distance; and
   each of the memory cells in the plurality of memory cells have a memory cell area, the memory cell area having a first side along the first direction and a second side along the second direction, the first side having a length equal to the summation of the bit line width and the bit line separation distance, the second side having a length equal to the summation of the word line width and the word line separation distance.

21. The method of claim 20, wherein the length of the first side is equal to twice a feature size F, and the length of the second side is equal to twice the feature size F, such that the memory cell area is equal to 4 $F^2$.

* * * * *